United States Patent [19]

Yamashita et al.

[11] 4,198,605
[45] Apr. 15, 1980

[54] CHANNEL SELECTING APPARATUS IN A RECEIVER

[75] Inventors: Norio Yamashita; Toshiyuki Ozawa, both of Oora, Japan

[73] Assignees: Sanyo Electric Co., Ltd., Moriguchi; Tokyo Sanyo Electric Co., Ltd., Oora, both of Japan

[21] Appl. No.: 859,265

[22] Filed: Dec. 9, 1977

[30] Foreign Application Priority Data

| Dec. 16, 1976 | [JP] | Japan | 51-153015 |
| Dec. 16, 1976 | [JP] | Japan | 51-153016 |
| Dec. 16, 1976 | [JP] | Japan | 51-153017 |
| Dec. 16, 1976 | [JP] | Japan | 51-153018 |
| Dec. 16, 1976 | [JP] | Japan | 51-153019 |
| Dec. 16, 1976 | [JP] | Japan | 51-153020 |

[51] Int. Cl.$^2$ .............................................. H04B 1/32
[52] U.S. Cl. ................................................... 455/161
[58] Field of Search ........................ 325/464, 470, 459

[56] References Cited

U.S. PATENT DOCUMENTS

| 3,968,440 | 7/1976 | Ehni | 325/464 |
| 4,038,689 | 7/1977 | Rzeszewski et al. | 325/464 |
| 4,048,570 | 9/1977 | Sumi | 325/464 |
| 4,081,752 | 3/1978 | Sumi | 325/470 |

Primary Examiner—Robert L. Griffin
Assistant Examiner—Joseph A. Orsino, Jr.
Attorney, Agent, or Firm—Darby & Darby

[57] ABSTRACT

A superheterodyne receiver comprising a high frequency amplifier, a local oscillator implemented by a frequency synthesizer including a phase locked loop, a mixer, an intermediate frequency amplifier, an up down counter for providing data concerning frequency division rate of a programmable counter in the phase locked loop, characterized in that the up down counter is structured such that the counter is responsive to a command signal from an upward scanning switch to make an upward counting operation and is responsive to a command signal from a downward scanning switch to make a downward counting operation and is further responsive to command signals simultaneously obtained from these two upward and downward scanning switches to make a consecutive upward or downward counting operation, whereby a receiving channel is consecutively selected in the upward or downward direction in a fast scanning manner. Preferably, a fast scanning operation responsive to simultaneous depression of the two upward and downward scanning switches is stopped responsive to a receiving signal such as an intermediate frequency signal or a detected signal obtained when a broadcasting channel is selected. Preferably, a digital channel display is provided such that the data representative of the channel being selected obtainable from a control is transferred in a bit serial signal format to the display, wherein the pulses having a pulse width wider than a predetermined value are utilized for the purpose of data processing, thereby to eliminate any adverse affect due to noise during the transmission of the data.

28 Claims, 23 Drawing Figures

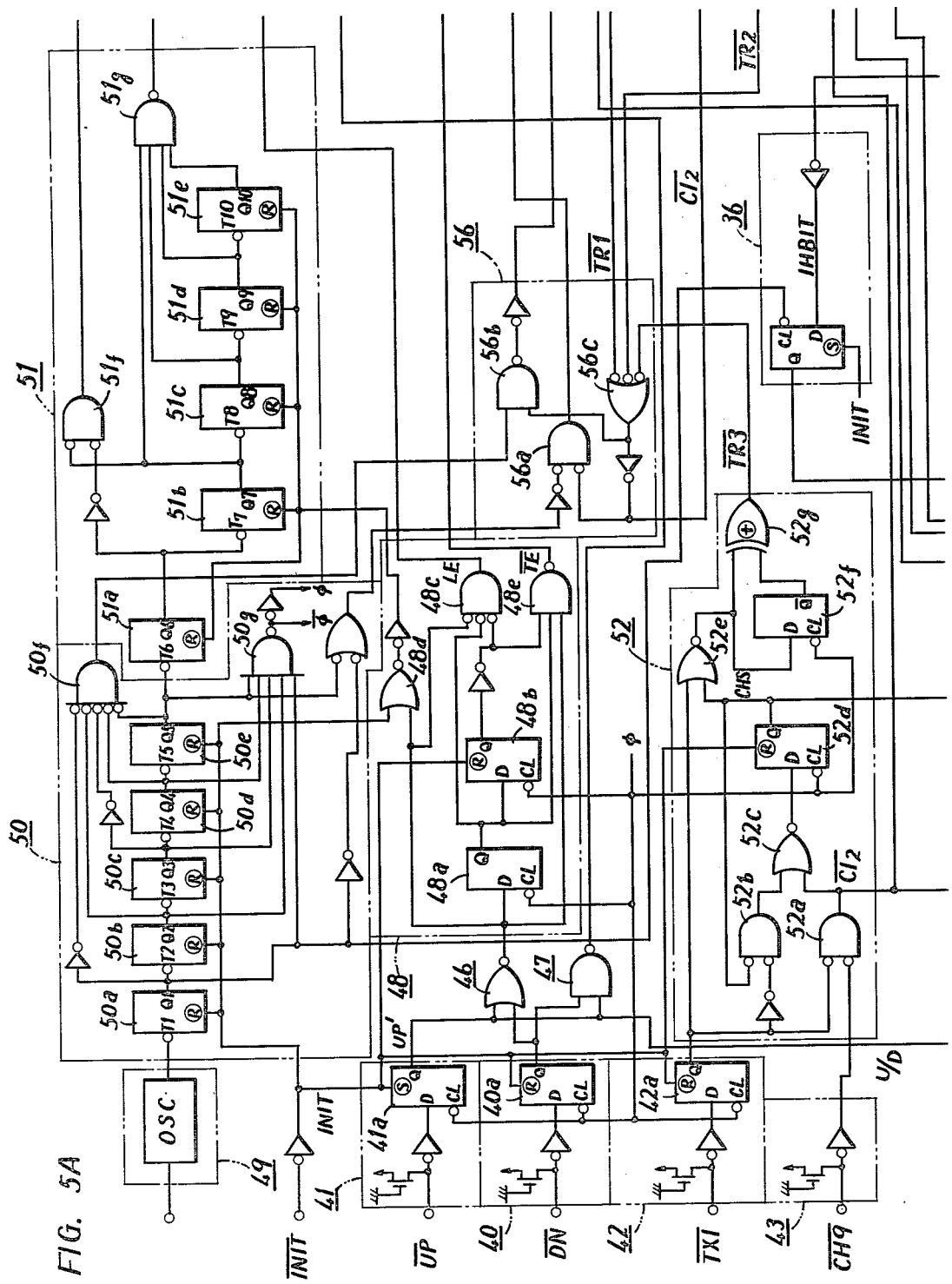

CHANNEL SELECTING APPARATUS IN A RECEIVER

BACKGROUND OF THE INVENTION

1. Field of the Invention:

The present invention relates to a channel selecting apparatus in a receiver. More specifically, the present invention relates to a channel selecting apparatus in a transceiver employing a frequency synthesizer.

2. Description of the Prior Art:

As well known, in a receiver such as a transceiver, it is required to generate a local oscillation signal in order to provide an intermediate frequency signal in a reception mode of the receiver. It is further required that such local oscillation signal be changed in frequency depending on the frequency of a channel whose reception is desired. To that end, a frequency synthesizer including a phase locked loop has been advantageously employed in transceivers, inasmuch as it can provide a much more stabilized oscillation frequency.

A frequency synthesizer employing a phase locked loop usually comprises a voltage controlled oscillator the oscillation frequency of which is controllable as a function of an output voltage, as low pass filtered, obtained from a phase detector, which is adapted to compare the phase or the frequency of the output from a reference oscillator and the phase or the frequency of an output from a programmable frequency divider adapted to frequency divide the output frequency from the said voltage controlled oscillator at the frequency division rate which is adapted to be variable as a function of a control signal. Automatic scanning of the oscillation frequency of the output from the said voltage controlled oscillator is effected by varying the said control signal and thus the frequency division rate of the programmable frequency divider.

A conventional transceiver is structured to include a push-button switch for the purpose of selecting a channel, for communication. More specifically, a typical conventional transceiver comprises an upward directional scanning pushbutton switch for causing variation of the tuning frequency, or the channel, in the upward direction and a downward directional scanning push-button switch for causing variation of the tuning frequency, or channel, in the downward direction. One type of a conventional transceiver is structured such that scanning is effected on a one by one basis in terms of channels in the upward or downward direction responsive to depression of an upward or downward push-button switch for a relatively short time period. However, this requires that the push-button switch be depressed repeatedly many times to select a desired channel which is far by many channels from the channel which has been presently selected, with the result of tiresomeness of the channel selecting operation.

In order to eliminate tiresomeness of channel selecting operation on a one by one basis in terms of channels in the scanning operation, a so-called fast scanning of the channels may be advantageously adopted. A transceiver of a fast scanning type is structured such that depression of an upward or downward scanning push-button switch for more than a predetermined time period makes an automatic consecutive channel selection in a fast scanning rate. Nevertheless, a conventional fast scanning scheme has been merely to achieve a rapid rate of channel scanning.

An automatic search scheme has also been proposed wherein the above described fast scanning of the channels is automatically stopped responsive to a signal received in a given channel. However, an automatic search scheme cannot be achieved in a simple fast scanning scheme. More specifically, in order to achieve automatic search, it is required to provide separate mode switches for selectively setting fast scanning mode and an automatic search mode. Alternatively, it is required to provdide a particular push-button switch for setting an automatic search mode. Thus, in order to achieve an automatic search scheme, it is required to provide separately a particular switch for setting an automatic search mode. However, this makes the structure complicated and the cost expensive.

By way of another example, a system may be considered wherein each depression of one switch causes advancement of one channel while each depression of the other switch causes advancement of a predetermined plurality of channels, say ten channels, whereby the channels can be advanced selectively in a fine manner or a coarse manner. As a result, in order to reach a relatively remote channel from the channel which has been presently selected, the said other switch is depressed for the purpose of coarse advancement of the channels and thereafter the said one switch is depressed for the purpose of fine advancement of the channels. Nevertheless, such channel selecting operation is still tiresome and is not particularly preferred in receivers which are very often employed in vehicles such as automobiles.

SUMMARY OF THE INVENTION

According to the present invention, a superhetrodyne receiver is provided wherein a received high frequency is mixed with a local oscillation signal to provide an intermediate frequency signal, the local oscillator being implemented by a frequency synthesizer including a phase locked loop. An up down counter is provided for providing data concerning frequency division rate of a programmable counter in the phase locked loop, and the up down counter is structured such that the counter is responsive to a command signal from an upward scanning switch to make an upward counting operation and is responsive to a command signal from a downward scanning switch to make a downward counting operation. The counter is further responsive to command signals simultaneously obtained from these two upward and downward scanning switches to make a consecutive upward or downward counting operation, whereby a receiving channel is consecutively selected in the upward or downward direction in a fast scanning manner.

In a preferred embodiment of the present invention, a fast scanning operation responsive to simultaneous depression of the two upward and downward scanning switches is stopped responsive to a receiving signal such as an intermediate frequency signal or a detected signal obtainable when a broadcasting channel is selected. In another preferred embodiment of the present invention, a digital channel display is provided, such that the data representative of the channel being selected obtainable from a control is transferred in a bit serial signal format to the display. In this case the pulses having a pulse width wider than a predetermined value are utilized for the purpose of data processing, thereby to eliminate an adverse affect by a noise during the transmission of the data.

Therefore, a principal object of the present invention is to provide a station selecting apparatus in a receiver comprising a frequency synthesizer including a phase locked loop as a local oscillator, wherein individual channel selection and automatic scanning channel selection can be achieved by the use of a less number of operation switches.

Another object of the present invention is to provide a channel selecting apparatus in a receiver comprising a frequency synthesizer including a phase locked loop as a local oscillator, wherein individual channel selection in either upward or downward direction and automatic scanning channel selection in a predetermined upward or downward direction can be achieved by the use of upward and downward scanning switches.

A further object of the present invention is to provide a channel selecting apparatus in a receiver comprising a frequency synthesizer including a phase locked loop as a local oscillator, wherein individual channel selection and automatic scanning channel selection can be achieved with a simple manual operation.

Still a further object of the present invention is to provide a channel selecting apparatus in a receiver comprising a frequency synthesizer including a phase locked loop as a local oscillator, wherein individual channel selection and automatic scanning channel selection can be achieved with a simple manual operation by the use of a circuit configuration suited for implementation in an integrated circuit.

These objects and other objects, features, aspects and advantages of the present invention will be better understood from the following detailed description of the preferred embodiments of the present invention when taken in conjunction with the accompanying drawings:

BRIEF DESCRIPTION OF THE DRAWINGS

FIGS. 5A through 5C are block diagrams showing in more detail the control circuit in the FIG. 3 embodiment;

DESCRIPTION OF THE PREFERRED EMBODIMENTS

Figure 1:
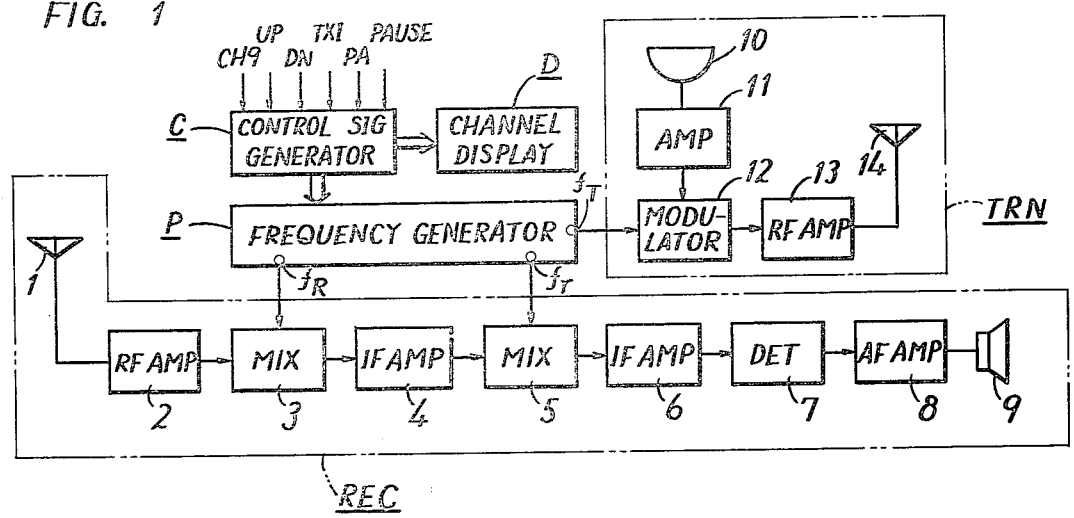
FIG. 1 is a block diagram showing a transceiver embodying the present invention.

Referring to FIG. 1, a typical example of a transceiver embodying the present invention is described. The transceiver shown comprises a receiver portion REC for receiving a transmitted wave signal to convert the same into an audible sound, and a transmitter portion TRN for converting an audible sound into a transmitting wave to transmit the same. Such transceiver may include a frequency signal generator P for providing local frequency outputs $f_R$ and $f_r$ and a carrier frequency output $f_T$ to the receiver portion REC and the transmitter portion TRN, respectively. The frequency signal generator P is operatively coupled to a control signal generator C to be controlled for selectively generating the frequency outputs $f_R$, $f_r$ and $f_T$, such that these frequency outputs $f_R$, $f_r$ and $f_T$ are changed depending on the channel to be used for communication. The data from the control signal generator C is applied to a channel display D for the purpose of displaying the data in a digital manner.

The receiver portion REC comprises an antenna 1 for receiving a transmitted wave, a high frequency amplifier 2 for amplifying the received wave signal, a first mixer 3 for mixing the high frequency output from the amplifier 2 with a first local oscillation frequency output $f_R$ from the frequency signal generator P for providing an intermediate frequency output, a first intermediate frequency amplifier 4 for amplifying the intermediate frequency output from the mixer 3, a second mixer 5 for mixing the intermediate frequency output from the first intermediate frequency amplifier 4 with a second local oscillation frequency output $f_r$ from the frequency signal generator P, a second intermediate frequency amplifier 6 for amplifying the second intermediate output from the second mixer 5, a detector 7 for detecting the intermediate frequency output from the second intermediate frequency amplifier 6 for providing an audio frequency output, an audio frequency amplifier 8 for amplifying the audio frequency output from the detector 7, and a loud speaker 9 for transducing the audio frequency output from the amplifier 8 into a sound output. The output from the above described detector 7 or the output from the second intermediate frequency amplifier 6 is utilized as a signal PAUSE for stopping a search operation to be described subsequently.

The transmitter portion TRN comprises a microphone 10 for converting a sound into an audio electrical signal, an audio amplifier 11 for amplifying the audio electrical signal from the microphone 10, a modulator 12 for modulating a carrier signal of the carrier frequency output $f_T$ from the frequency signal generator P with the amplified audio signal for providing a modulated signal, a high frequency amplifier 13 for amplifying the modulated signal from the modulator 12, and a transmitting antenna 14 for transmitting the high frequency output of the modulated signal from the amplifier 13.

The present invention is directed to an improvement in the frequency signal generator P for use in such a transceiver comprising a receiver portion REC and a transmitter portion TRN as described above. Such a frequency signal generator P is adapted to provide different frequency outputs selectively to the mixers 3 and 5 of the receiver portion REC and the modulator 12 of the transmitter portion TRN, respectively, on the selection of the receiving mode and the transmitting mode, respectively. In case of the receiving mode, for example, the frequency of the carrier wave signal as received by the antenna 1 ranges from 26.965MHz to 27.705MHz, forexample, such that each channel occupies a corresponding frequency band. Therefore, in order to obtain a constant intermediate frequency of 10.695MHz, the frequency signal generator P should be adapted such that the frequency signal output $f_R$ from the generator P is adaptably changed over a range of frequencies from 37.66MHz to 38.10MHz in association with the receiving channels. On the other hand, in case of the transmitting mode, in order to change the frequency of the carrier wave over a range from 26.965 MHz to 27.405 MHz in association with the transmitting channels, the frequency signal generator P should be adapted such that the frequency of the frequency signals $f_T$ from the generator P is adaptably changed accordingly within the above described frequency range. In other words, the frequency signal generator P should provide an output of the variable frequency in association with the transmitting channels and the receiving channels. To that end, a receiver employing the frequency signal generator P is provided with a transmitter/receiver selection switch for selectively switching the transmitting mode or the receiving mode.

Figure 2:
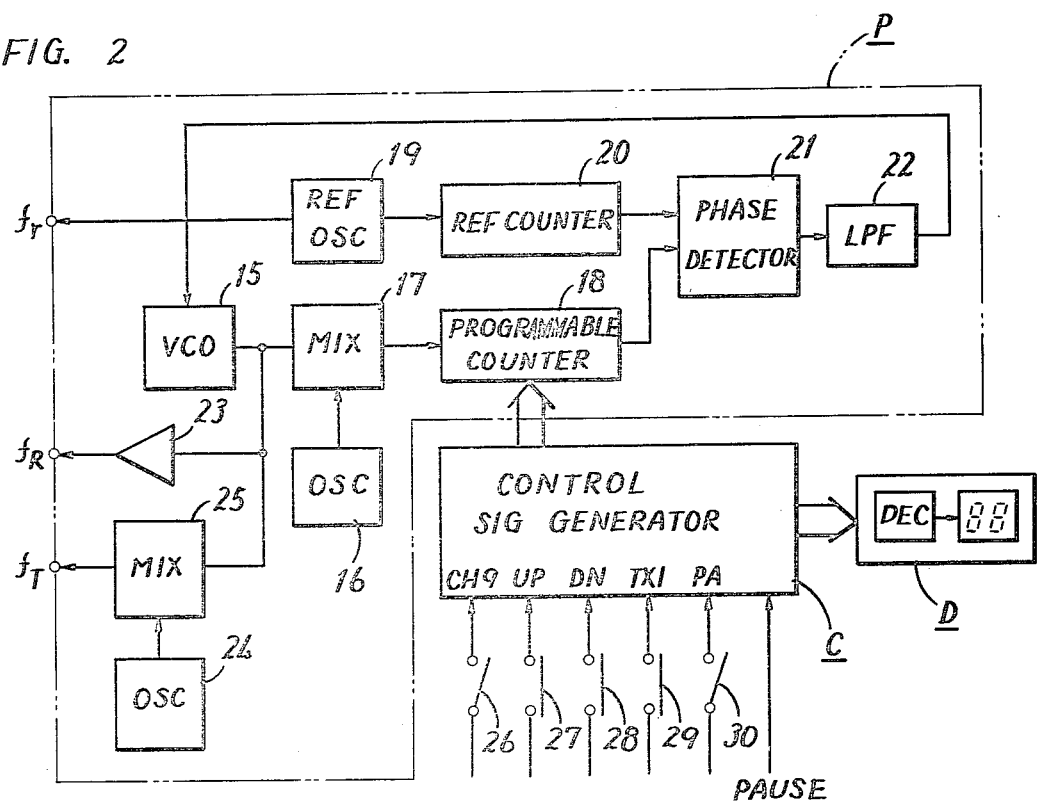
FIG. 2 is a block diagram showing in detail a frequency generator in the FIG. 1 transceiver.

FIG. 2 shows a block diagram of the frequency signal generator P shown in FIG. 1. The frequency signal generator P basically comprises a voltage controlled oscillator 15. The voltage controlled oscillator 15 is structured such that the oscillation frequency thereof is varied as a function of a control voltage applied thereto. The oscillation output from the voltage controlled oscillator 15 is withdrawn through a buffer 23 from an output terminal $f_R$. The oscillation output from the voltage controlled oscillator 15 is also applied to a mixer 25, where the oscillation output is mixed with the reference frequency output from a reference signal oscillator 24 which is preferably a crystal controlled oscillator. The frequency converted output thus obtained is withdrawn from an output terminal $f_T$. Thus, it is appreciated that the frequency signal generator P shown comprises two output terminals, i.e. the output terminal $f_T$ for a transmitting mode and the output terminal $f_R$ for a receiving mode. The output obtained from the transmitting mode terminal $f_T$ is applied to the modulator 12 in the FIG. 1 transceiver to be used as a carrier wave signal, whereas the output obtained from the receiving mode terminal $f_R$ is applied to the mixer 3 in the FIG. 1 transceiver to be used as a local oscillation frequency signal. In the frequency signal generator P shown, a control voltage to be applied to the voltage controlled oscillator 15 is provided as an output from a phase detector 21, as filtered by means of a low pass filter 22. The phase detector 21 is connected to receive, at one input thereto, an output from a frequency divider or a reference counter 20, which is connected to receive an output from a reference oscillator 19. The reference oscillator 19 is preferably a crystal controlled oscillator as described previously. The output from the reference oscillator 19 is also withdrawn through the output terminal $f_r$. The phase detector 21 is also connected to receive, at the other input thereto, an output from a programmable frequency divider 18, which typically comprises a programmable counter. The programmable frequency counter 18 is connected to receive a pulse output from a mixer 17 for the purpose of counting the number of pulses at the programmed rate and is also connected to receive a control signal from the control signal generator C for the purpose of controlling the said programmed rate.

The above described phase detector 21 serves to compare the phase of the reference signal obtained from the reference counter 20 with the phase of the signal being controlled obtained from the programmable counter 18 to provide a signal associated with the difference between the phases of the signal being controlled from the programmable counter 18 and the reference signal from the reference counter 20 such that the above described phase difference associated signal may be positive if and when the frequency of the signal being controlled from the programmable counter 18 is higher than the frequency of the reference signal from the reference counter 20 and vice versa.

The above described control signal generator C is structured to be responsive to input signals CH9, UP, DN, TXI, PA and PAUSE to control the above described frequency signal generator P. The signal CH9 is obtained when an emergency switch 26 is turned on. The control signal generator C is responsive to the signal CH9 to control the programmable counter 18 such that a frequency signal for communication by the use of a prescribed channel "Channel 9" allotted for emergency communication is generated. The signal UP or DN is obtained when an upward scanning switch 27 or a downward scanning switch 28, respectively, is depressed. The control signal generator C is responsive to the signal UP or DN to control the programmable counter 18 such that the count value in the counter is advanced on a step by step basis so as to change the communication channel for transmission or reception on a one by one channel basis in the upward or downward direction. The signal TXI is obtained when a transmission switch 29, such as a so-called press-to-talk switch, is turned on. The signal PA is obtained when a switch 30 for using the amplifier in the transceiver as a public address is turned on. The signal PAUSE to be applied to the control signal generator C may be the output from the intermediate frequency amplifier or the output from the detector 7, for example. The control signal generator C is responsive to these signals CH9, UP, DN, TXI, PA and PAUSE to generate frequency division data to the programmable counter 18 and display data to a display D for displaying the state of the transceiver, such as a communication channel or the like. It is pointed out that the present invention is directed to an improvement in such control signal generator C.

Figure 3:
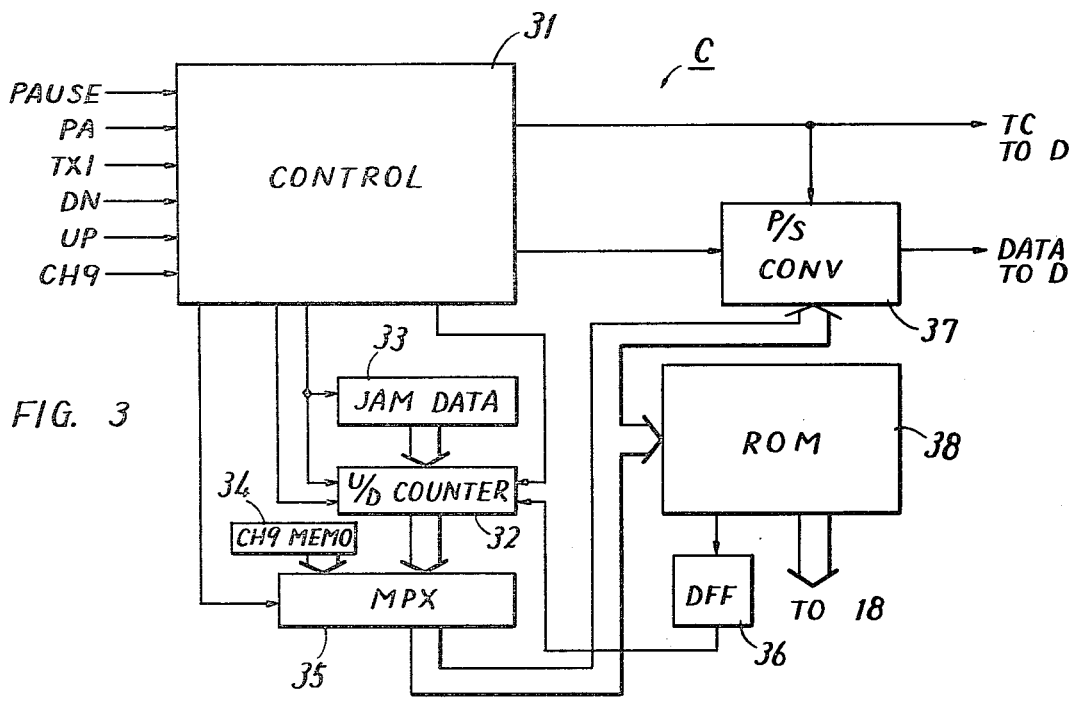
FIG. 3 is a block diagram showing one embodiment of the present invention.

FIG. 3 shows a block diagram of the control signal generator C. The control signal generator C shown comprises a control circuit 31 responsive to the above described signals CH9, UP, DN, TXI, PA and PAUSE for generating various control signals, an up down counter 32 responsive to the count pulse and the control signal from the control circuit 31 for making an up count or down count operation, a jam data circuit 33 for loading a prescribed data to the up down counter 32, a storing circuit 34 for storing the above described signal CH9, and a multiplexer 35 responsive to the signal from the control circuit 31 for selectively withdrawing the output from the up down counter 32 (Channel N) or the output from the Channel 9 storing circuit 34. The signal from the multiplexer 35 is applied to a read only memory (ROM) 38 and is also applied to a parallel/serial converter 37. The read only memory is responsive to the input data to generate the corresponding frequency division data to the programmable counter 18 and is further structured to provide the output to a delay flip-flop 36 in a particular situation.

The jam data circuit 33 stores the data to be forcibly loaded in the up down counter 32, such that the count value data corresponding to Channel 1 and Channel 40 is preloaded if the transceiver is structured to cover Channels 1 through 40, for example. The jam data circuit 33 is responsive to the signal from the control circuit 31 to load the data concerning Channel 1 to the up down counter 32 in the upward scanning mode of the transceiver and hence in the up count mode of the up down counter and to load the data concerning Channel 40 to the up down counter 32 in the downward scanning mode of the transceiver and hence in the down count mode of the up down counter 32. The parallel/serial converter 37 serves to convert the parallel data fed through the multiplexer 35 into serial data, which is transferred to the display D. The read only memory 38 stores the frequency division data corresponding to the addressing data obtainable from the multiplexer 35 and the frequency division data as addressed is applied to the programmable counter 18. The read only memory 38 is further structured such that if and when the addressing data for addressing the frequency division data not stored (in the above described example, the addressing data corresponding to Channel 0 or 41 or above) is applied a triggering signal INHIBIT is obtained and is applied to a delay flip-flop 36. The delay flip-flop 36 is responsive to the leading edge of the triggering signal INHIBIT from the read only memory 38 to provide a control signal to the up down counter 32 for writing the data from the jam data circuit 33 to the up down counter 32.

Figure 4:
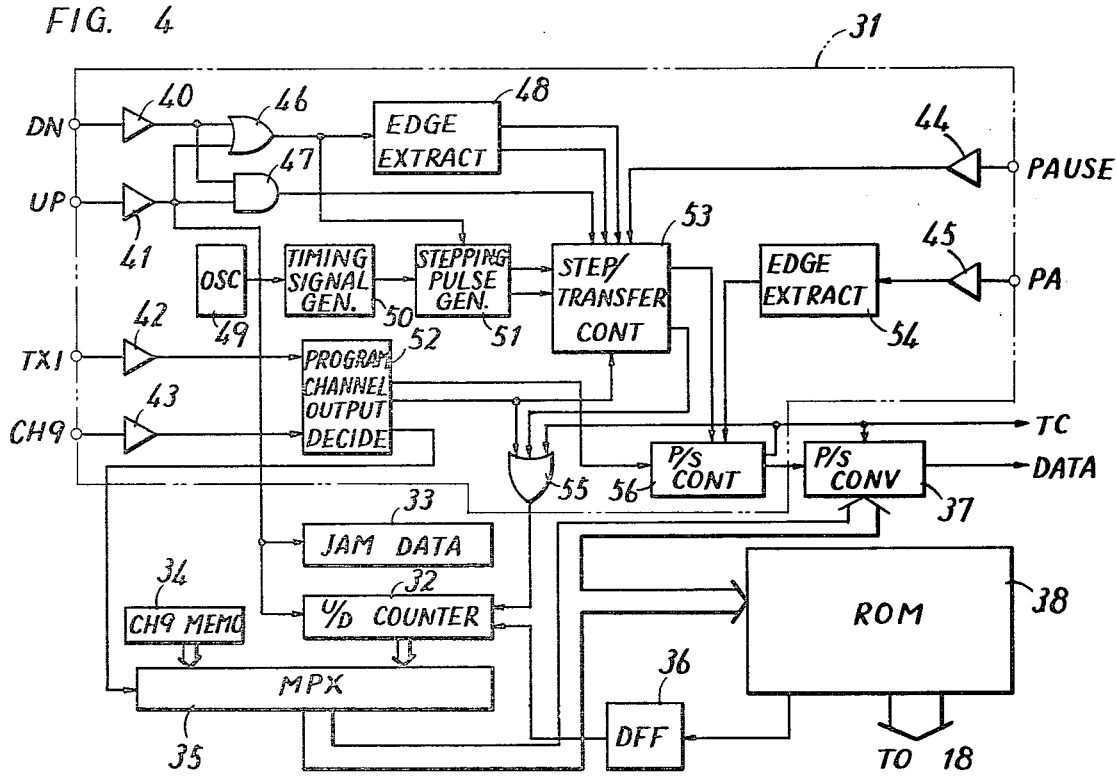
FIG. 4 is a block diagram of a control circuit in the FIG. 3 embodiment.

The control circuit 31 is shown in more detail in FIG. 4. Referring to FIG. 4, the control circuit 31 comprises buffers 43, 41, 40, 42, 45 and 44 for receiving, wave shaping and timing the above described signals CH9, UP, DN, TXI, PA and PAUSE, respectively. The outputs from the buffers 43 and 42 are applied to a program channel output decision circuit 52. The program channel output decision circuit 52 is responsive to the signals CH9 and TXI to determine which output, the output from the up down counter 32 or the output from the Channel 9 storing circuit 34, should be withdrawn, and the decision output from the program channel output decision circuit 52 is applied to the multiplexer 35 as a selection control signal. The output from the buffer 40 is applied to a logical sum gate 46 and a logical product gate 47 as an input thereto, while the output from the buffer 41 is applied to the logical sum gate 46 and the logical product gate 47 as the other input thereto. The output from the buffer 41 is also applied to the up down counter 32 and the jam data circuit 33. The output from the logical sum gate 46 is applied to an edge extracting circuit 48 and a stepping pulse generator 51. The edge extracting circuit 48 is responsive to the signals UP or DN to provide the signals representative of the leading and trailing edges of these signals, and the edge representing signals are applied to a step/transfer control circuit 53 for controlling the stepping operation of the up down counter 32 and the transfer of the data being displayed. The output from the logical product gate 47 is also applied to the step/transfer control circuit 53.

Figure 17:
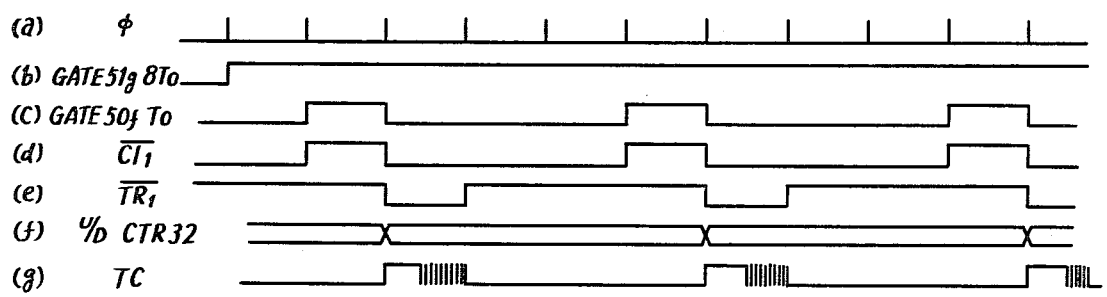

An oscillator 49 is provided to generate a pulse signal of a frequency for affording the basis of a timing signal required in the control circuit 31 and the output pulse signal is applied to the timing signal generator 50. The timing signal generator 50 is structured to generate various timing signals required in the control circuit 31, as to be more fully described subsequently with reference to FIGS. 12 and 13. Although the output from the timing signal generator 50 is shown applied through a single line to the stepping pulse generator 51 for facility of illustration, the output from the timing signal generator 50 is applied to various portions in the control circuit 31, as will become more apparent from the description to be made subsequently with reference to FIGS. 5A through 5C. The stepping pulse generator 51 is connected to receive the output from the logical sum gate 46 and is triggered responsive to the output from the logical sum gate 46 to provide the signals T0 and 8T0 of the periods as shown in FIG. 17, which are applied to the above described step/transfer control circuit 53. The step/transfer control circuit 53 is also structured to be responsive to the output from the buffer 44 and the output from the program channel output decision circuit 52 to provide control signals to an logical sum gate 55 and a parallel/serial control circuit 56. The output from the buffer 45 is applied to an edge extracting circuit 54 for extracting the leading edge of the signal PA. The output from the edge extracting circuit 54 is applied to the parallel/serial control circuit 56. The parallel/serial control circuit 56 serves to control the loading of the data into the parallel/serial converter 37 and the transfer of the data from the converter 37.

The above described various circuits will be described in more detail in the following. The program channel output decision circuit 52 generates a signal for determining which output, the output from the up down counter 32 or the output from the channel 9 storing circuit 34, should be selected by the multiplexer 35. The transition of the state in selection is shown in Table 1 and will be described in more detail in the following.

Table 1

|   |   |
|---|---|
|  | (0, 1) |
|  | (1, 1) |
| CH9 | (1, 0) |
| (0, 0)  (1, 0) |   |
| CHN | (0, 1) |
|  | (1, 1) |
|  | (0, 0) |

Referring to Table 1, the representations in the parentheses such as (0, 0), (1, 0), (1, 1) . . . each denote the states of the signals CH9 and TXI, respectively, to be applied to the control signal generator C. On the other hand, the representations "CH9" and "CHN" each represent the channel selection state and the arrow marks show how the state is shifted with respect to the combination of the signals CH9 and TXI shown in the vicinity thereof. In the internal state CH9, the output from the Channel 9 storing circuit 34 is applied through the multiplexer 35 to the parallel/serial converter 37 and the read only memory 38. In the channel selection state CHN, the output from the up down counter 32 is applied through the multiplexer 35 to the parallel/serial converter 37 and the read only memory 38.

Referring to Table 1, in a case where channel selection state is the state CHN and the combination of the signals CH9 and TXI is (0, 0), for example, then the state remains unchanged and remains in the state CHN. Now assuming that the combination of the signals becomes (1, 0) in such a situation, then the state is shifted to the state CH9. As is clear from Table 1, in a case where the transmission state commanding signal TXI is received, i.e. in a case where the press-to-talk switch 29 (FIG. 2) is turned on, the channel selection state of the control circuit 31 is not shifted. In other words, in a case where the transceiver is in the transmission state, the transition of the state is inhibited, thereby to prevent radiation of an undesired electric wave in a transient period. The program channel output decision circuit 52 provides through the logical sum gate 55 to the up down counter 32 a signal indicating that either signal CH9 or TXI is applied, thereby to inhibit the counting operation of the up down counter 32 for that period. The output signal indicating that either signal CH9 or TXI is received is also applied to the above described transfer control circuit 53.

The program channel output decision circuit 52 provides a signal to the parallel/serial control circuit 56 at the time when the above described internal state is shifted from CHN to CH9.

The step/transfer control circuit 53 provides a signal to the up down counter 32 through the logical sum gate 55 to control the counting operation and also provides a transfer timing signal to the parallel/serial control circuit 56 to transfer the new data in the up down counter 32 to the display D. The signal for controlling the counting operation of the up down counter 32 is generated by the suitable use of the signals of two kinds obtained from the stepping pulse generator 51, i.e. the signal of the period T0 and the signal of the period 8T0.

The stepping pulse generator 51 will be described in more detail. If and when either the signal UP or DN is received through the logical sum gate 46, then the leading edge signal is first obtained. If the signal of the period 8T0 is received from the timing signal generator 50, then the signal of the period T0 is thereafter used as a count pulse. In other words, if either the signal UP or DN is received, the count pulse is simultaneously withdrawn and after a lapse of the time period 8T0, the count pulse is obtained at the period T0. In a case where the signals UP and DN are obtained simultaneously, immediately the signal of the period T0 is utilized as a count pulse. However, if the signal PAUSE is obtained in such a case, the output of the stepping pulse is inhibited. Such count pulse is delayed and is applied to the parallel/serial control circuit 56, whereby transfer of the data to the display D is controlled.

The operation of the step/transfer control circuit 53 with respect to the combination of the respective signals applied to the control signal generator C is shown in Table 2.

Note 1: As soon as this state is assumed, the up down counter 32 is advanced and the display data N corresponding to the contents therein is obtained and the frequency division data CHN is obtained from the programmable counter 18 corresponding to the channel N is obtained. If and when this state is kept more than the time period 8T0, the up down counter 32 is advanced one by one for each time period T0 and the display data corresponding to the content N in the counter 32 and the frequency division data are obtained each time.

Note 2: When this state is assumed, the up down counter 32 is stepped backward and the display data corresponding to the result is obtained and the frequency division data CHN of the programmable counter 18 corresponding to the channel N is obtained. If and when this state is kept more than the time period 8T0, the up down counter 32 is stepped backward one by one for each time period T0 and each time the display data and the frequency division data corresponding to the contents N in the counter 32 are obtained.

Note 3: If this state is assumed, the up down counter 32 is stepped one for each time period T0 and the display data and the frequency division data corresponding to the contents N in the counter 32 are obtained.

Figure 5B:
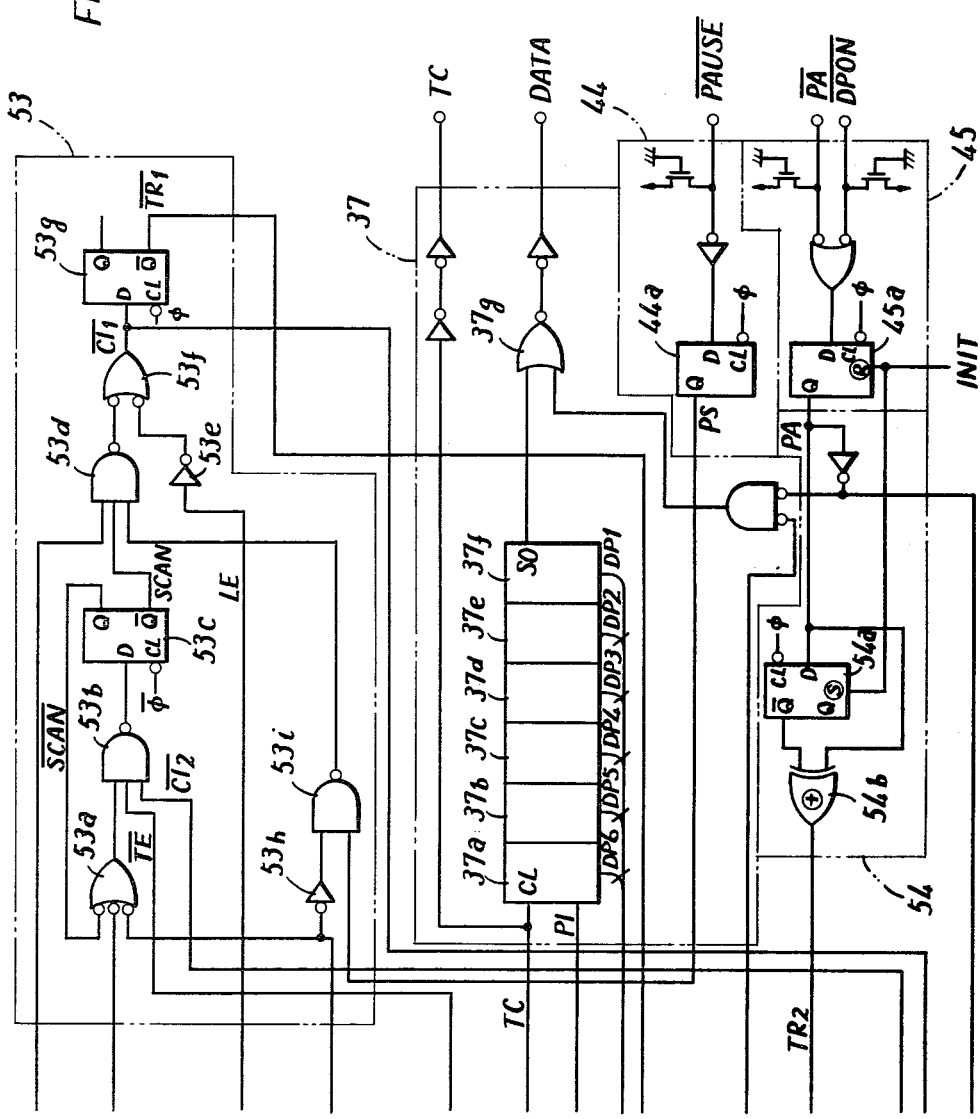
Figure 5C:
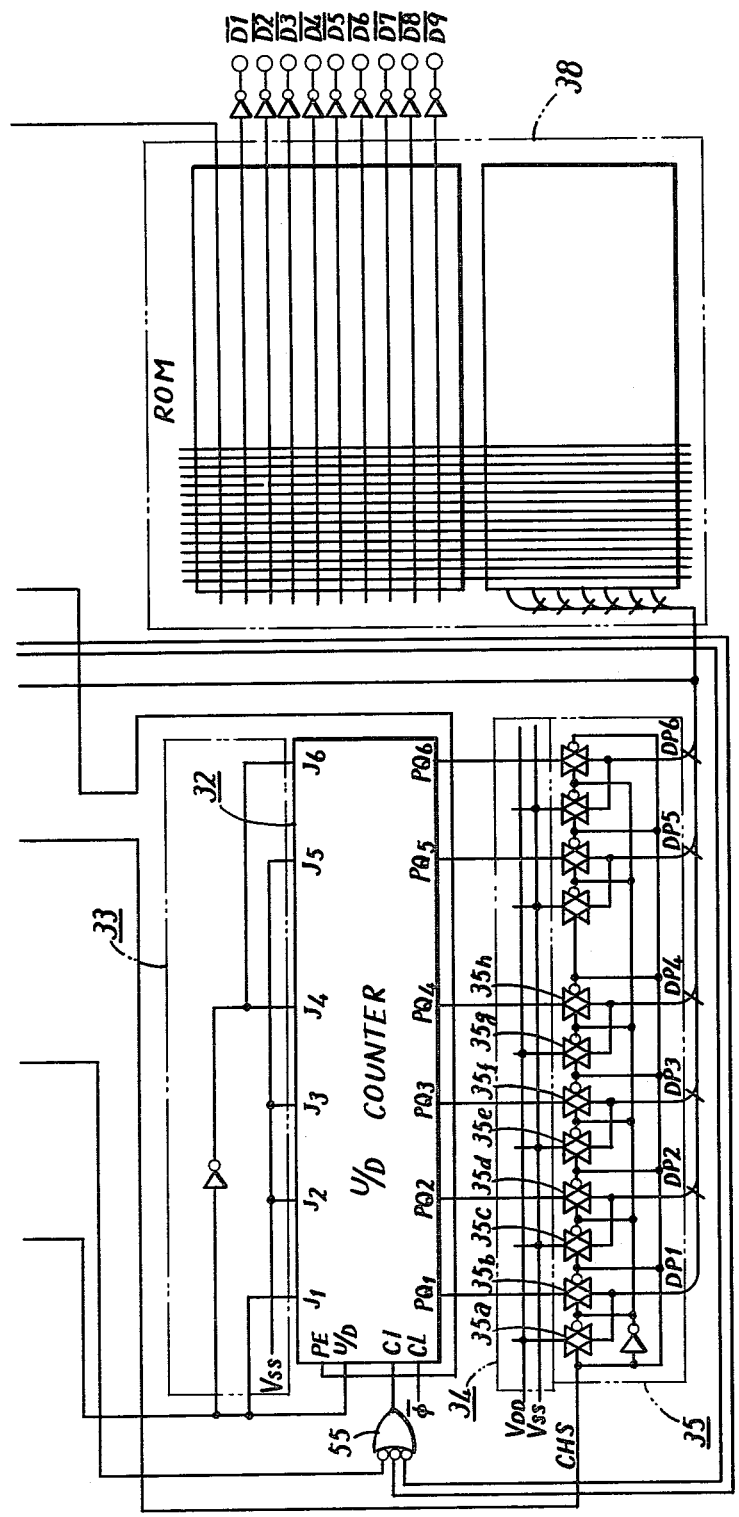
Figure 6:
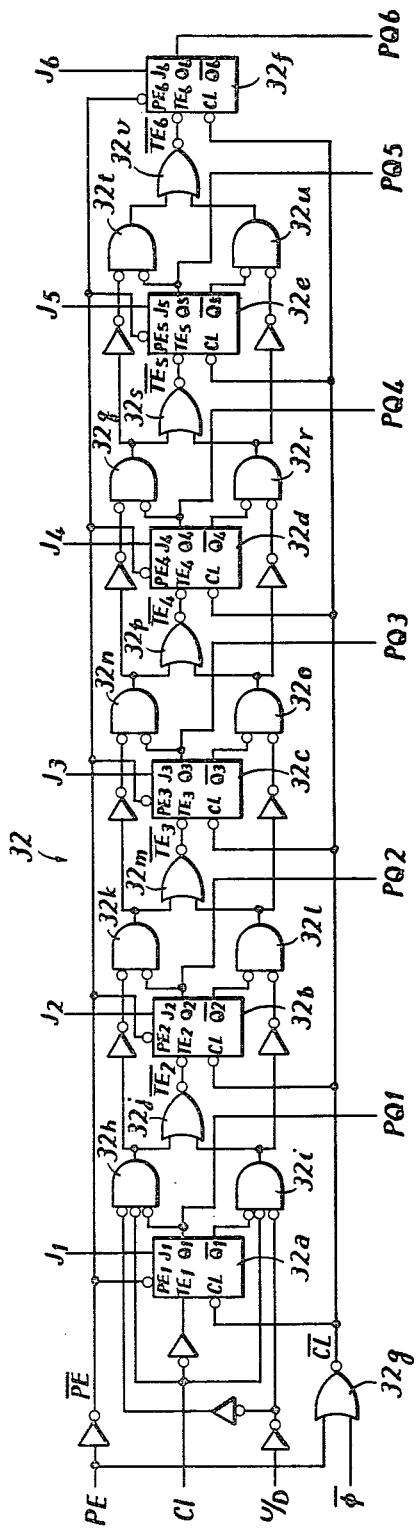
FIG. 6 is a block diagram showing in more detail an up down counter.

The circuit configuration of the FIG. 4 illustration is shown in more detail in FIGS. 5A through 5C. The up down counter 32 is shown in more detail in FIG. 6. Referring to FIG. 6, the up down counter 32 comprises six flip-flops 32a, 32b, 32c . . . , and 32f. The truth table of the first stage flip-flop 32a is shown in Table 3.

Table 3

| CL  | TE | $\overline{PE1}$ | J1 | Q | $\overline{Q}$ |
|-----|----|------|----|---|---|
| X   | X  | 0    | 0  | 0 | 1 |
| ⎺⎦  | 1  | 1    | X  | Q | Q |
| X   | X  | 0    | 1  | 1 | 0 |
| ⎺⎦  | 0  | 1    | X  | Q | Q |
| ⎦⎺  | X  | 1    | X  | Q | Q |

The truth table of the remaining flip-flops 32b through 32f is shown in Table 4.

Table 4

| CL  | $\overline{TE}$ | $\overline{PE}$ | J | Q | $\overline{Q}$ |
|-----|----|------|----|---|---|
| X   | X  | 0    | 0  | 0 | 1 |
| ⎺⎦  | 0  | 1    | X  | Q | Q |
| X   | X  | 0    | 1  | 1 | 0 |
| ⎺⎦  | 1  | 1    | X  | Q | Q |
| ⎦⎺  | X  | 1    | X  | Q | $\overline{Q}$ |

It is pointed out that the up down counter 32 is structured such that the counter 32 makes an up count operation when the input terminal U/D is supplied with the logic one and makes a down count operation when the input terminal U/D is supplied with the logic zero.

The jam data circuit 33 has six bit outputs J1 through J6. The output terminals J2, J3 and J5 have been forced to logic zero by means of the voltage source $V_{ss}$. The signal from the control circuit 31 is applied to the output terminal J1 and is, after being inverted, to the output terminals J4 and J6. Accordingly, if and when the signal from the control circuit 31 is a logic one, the outputs from the respective bit output terminals J1 through J6 of the jam data circuit 33 become the logic pattern "100000" representative of Channel 1, while if the signal from the control circuit 31 is the logic zero, the outputs from the respective bit output terminals J1 through J6 from the jam data circuit 33 become the logic pattern "000101" representing Channel 40.

The Channel 9 storing circuit 34 comprises six bit outputs, wherein the first and fourth bit outputs have been forced to the logic one by means of the voltage source $V_{DD}$ and the second, third, fifth and sixth bit outputs have been forced to the logic zero by means of the voltage source $V_{ss}$. Accordingly, the Channel 9 storing circuit 34 provides the output of the logic combination "100100" corresponding to Channel 9.

Figure 8:
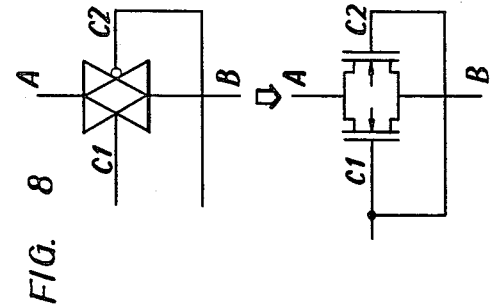
FIG. 8 is a diagram showing in more detail the connection of switching devices in the multiplexer shown in FIG. 5C.

The multiplexer 35 comprises a number of gate devices 35a, 35b, 35c, . . . . Such gate device is shown in more detail in FIG. 8. More specifically, such a gate device comprises a parallel connection of two field effect transistors inserted between lines A and B for gating the transfer of the signal from the line A to the line B. When the gate signal C1 for one field effect transistor corresponding to the signal CHS in FIG. 5(C) becomes the logic one, the gate signal C2 for the other field effect transistor becomes a logic zero and two field effect transistors becomes conductive simultaneously, whereby conduction is achieved between the lines A and B. If and when the gate signal C1 is a logic zero, both field effect transistors become non-conductive, whereby conduction between the lines A and B is interrupted. Two gate devices 35a and 35b form one set of gates, the other two gate devices 35c and 35d form another set of gates, and so on. One of each set of gates is connected to the data output line of the Channel 9 storing circuit 34 and the other of each set of gates is connected to the data output line of the up down counter 32. The output side of these two gate devices is commonly connected to the terminals DP1 through DP6. Therefore, if and when the signal CHS becomes a logic one, the muliplexer 35 provides the output of the Channel 9 storing circuit 39 in a bit parallel fashion, whereas if and when the signal CHS becomes a logic zero, the multiplexer 35 withdraws the output of the up down counter 32 in a bit parallel fashion.

Figure 13:
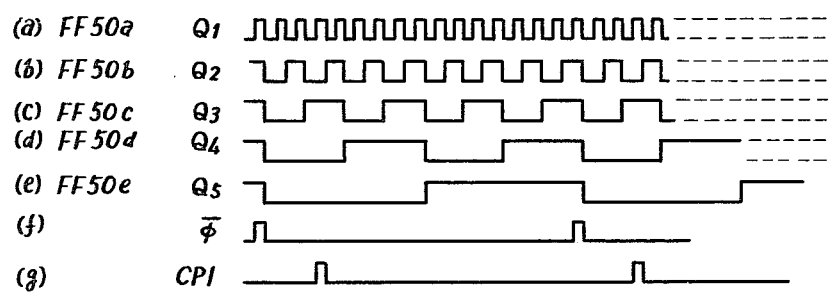

The delay flip-flop 36 is reset responsive to an initial signal INIT obtainable when the power supply is turned on and the storing state of the flip-flop 36 is controlled as a function of an inhibit signal INBIT from the read only memory 18, the output Q being applied to the input PE of the above described up down counter 32. The delay flip-flop 36 is supplied at the clock terminal CL with the output Q1 of the flip-flop 50a of the timing signal generator 50 (FIG. 13). The delay flip-flop 36 serves to provide a preset enable signal PE for at least one clock time period until loading of the data from the jam data circuit 33 to the up down counter 32 is completed.

Figure 7:
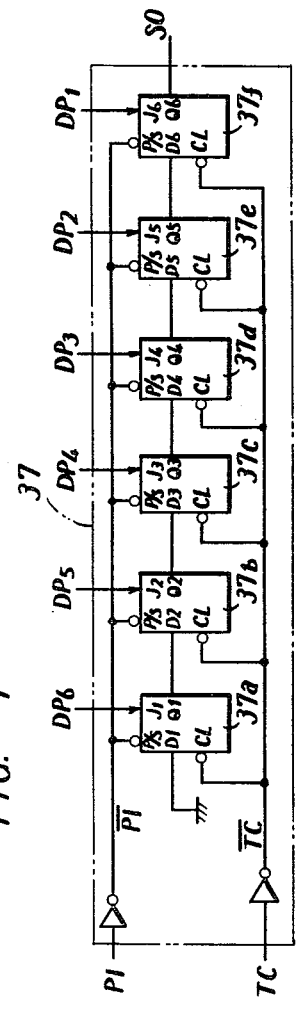
FIG. 7 is a block diagram showing in more detail a parallel/serial converter.

The major portion of the parallel/serial converter 37 is shown in more detail in FIG. 7. More specifically, the parallel/serial converter 37 comprises a series connected flip-flops 37a, 37b, . . . 37f. The truth table of these flip-flops is shown in Table 5.

Table 5

| CL | D | $\overline{P/S}$ | J | Q |
|---|---|---|---|---|
| X | X | 0 | 0 | 0 |
| X | X | 0 | 1 | 1 |
| ⌐L | 0 | 1 | X | 0 |
| ⌐L | 1 | 1 | X | 1 |
| ⌐Γ | X | 1 | X | Q |

The parallel/serial converter 37 serves to convert the data of the bit parallel output from the output terminals DP1 through DP6 of the multiplexer 35 into the data in a bit serial format to transfer the same to the display D.

Figure 9:
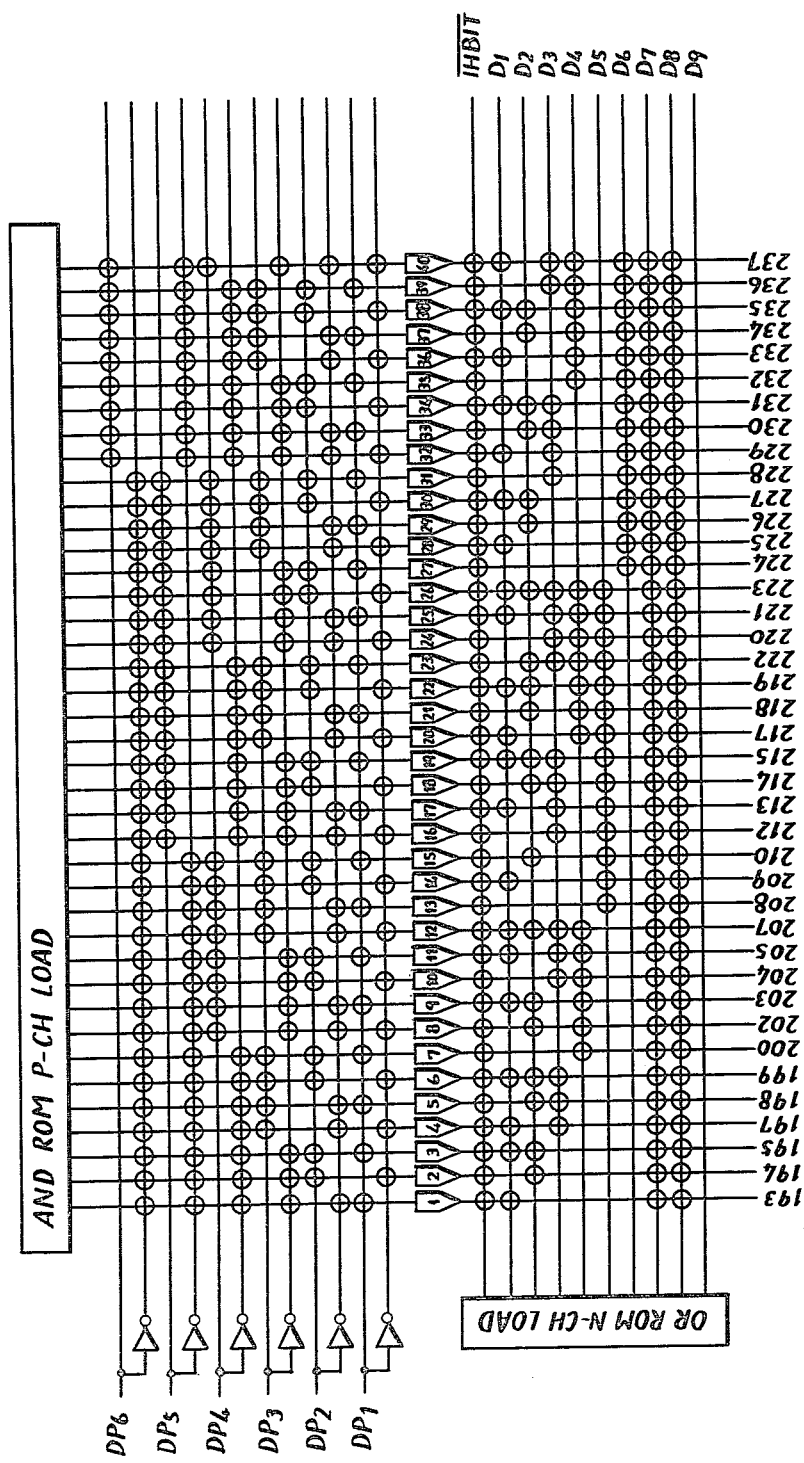
FIG. 9 is a schematic diagram showing in detail the read only memory.

The read only memory 38 is shown in more detail in FIG. 9. More specifically, the read only memory 38 is responsive to the data obtained from the output terminal DP1 through DP6 of the multiplexer 35 to provide the outputs D1 through D9 and $\overline{IHBIT}$. The outputs D1 through D9 are applied in a bit parallel fashion to the programmable counter 18 of the frequency signal generator P. The correlation between the input signals and the output signals of the read only memory 38 is shown in Table 6.

Referring to Table 6, let is be assumed that the input terminals DP1 through DP6 are the logic combination "100000". Then the output terminals D1 through D9 provide the logic combination "100000110" representing the frequency division rate corresponding to Channel 1. Similarly, assuming the input logic combination "000101", the output logic combination "101101110" representing the frequency division rate corresponding to Channel 40 is obtained. If and when the input signals representing the output data other than Channels 1 through 40 is received, the inhibit signal $\overline{IHBIT}$ is obtained as a logic zero.

Figure 10A:
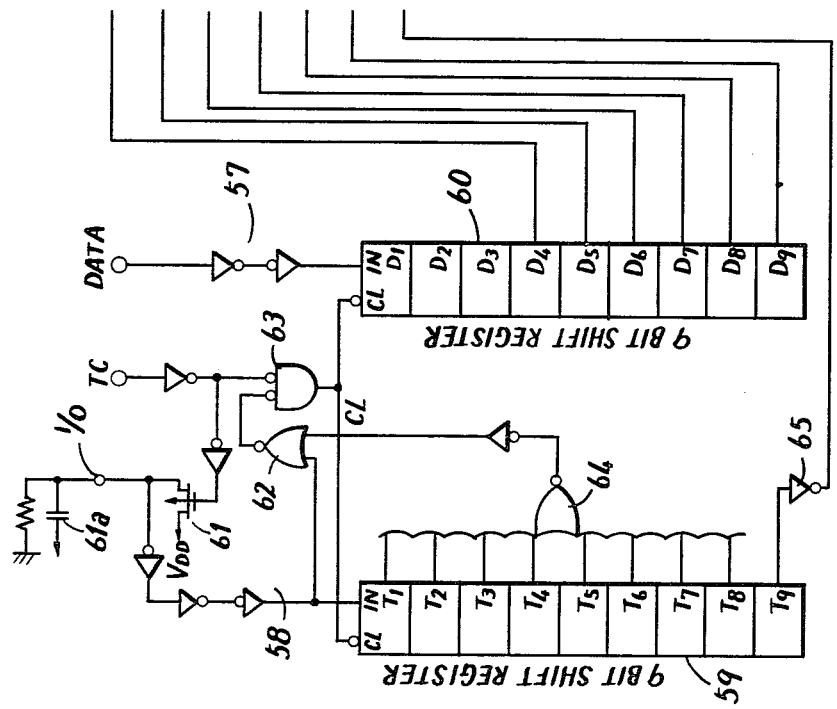
FIGS. 10A and 10B are schematic diagrams showing in more detail the decoder for a display.
Figure 11A:
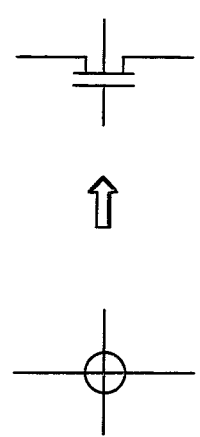
FIGS. 11A and 11B are schematic diagrams showing a connection in the read only memory.
Figure 11B:
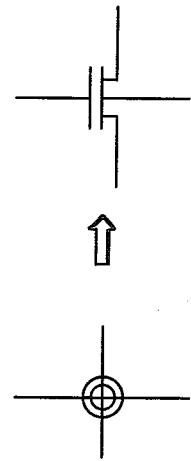
Figure 10B:
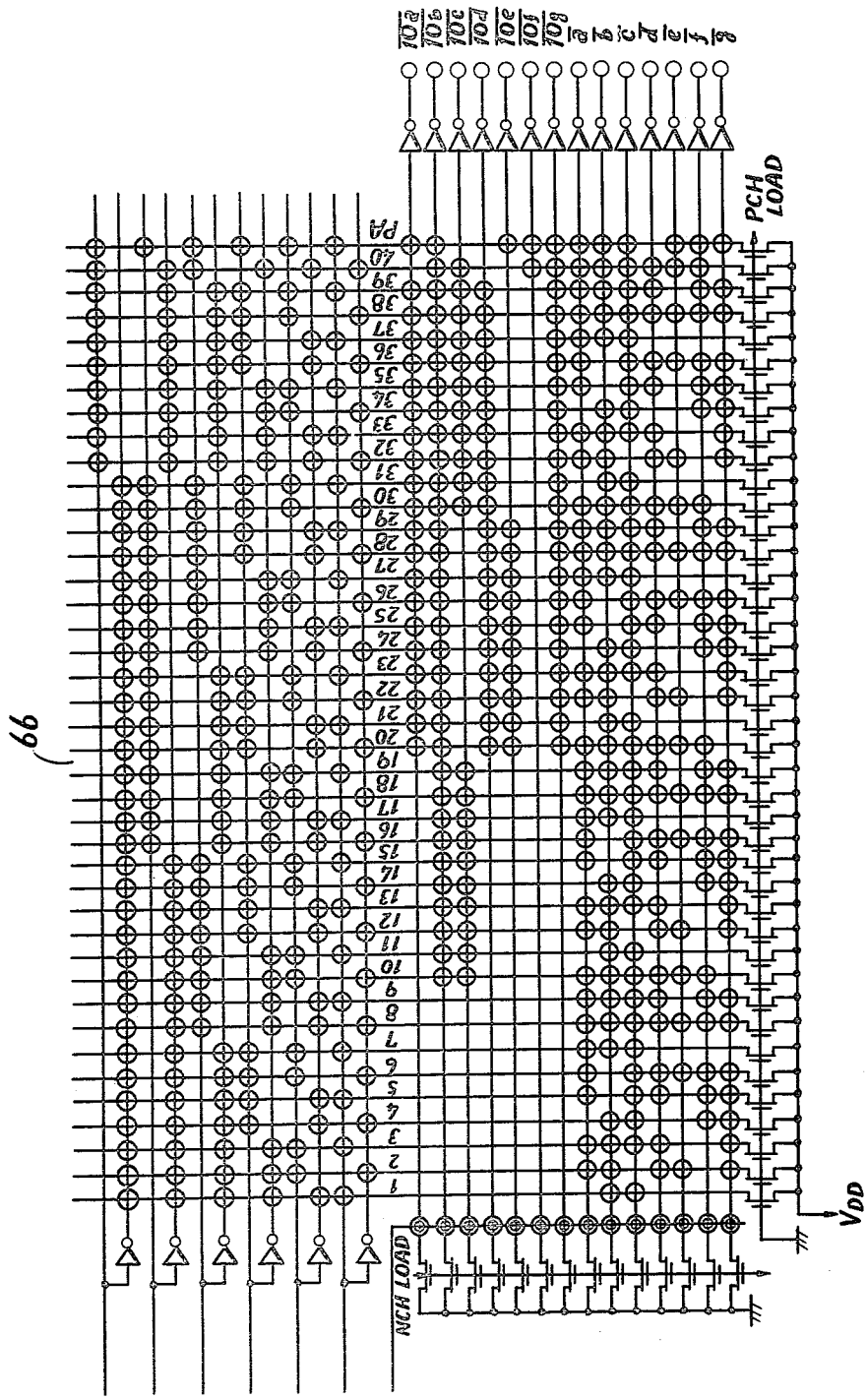
Figure 19:
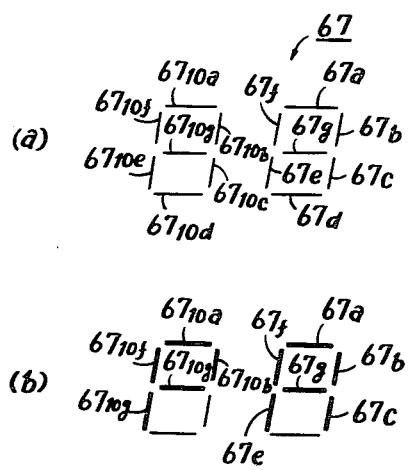
FIG. 19 shows an arrangement of the segments constituting a display.

The display D is shown in more detail in FIGS. 10A and 10B. More specifically, the display D comprises a terminal for receiving the data output from the parallel/serial converter 37 and a terminal for receiving the clock signal TC from the control circuit 31. The data input in a bit serial format is applied through an inverter 57 to a nine bit shift register 60. On the other hand, the timing signal TC is applied to an inverted OR gate 63 as one input thereto and is also applied to a field effect transistor 61 as a gate input. One electrode of the field effect transistor 61 is connected to the voltage source $V_{DD}$ and the other electrode of the field effect transistor 61 is connected through a terminal I/O to a pull down register, capacitor 61a and further through an inverter 58 to a nine bit shift register 59. The output of the inverter 58 is withdrawn through a NOR gate 64 receiving the outputs in a parallel fashion of eight bit cells of the nine bit shift register 59 and the output from the NOR gate 64 is applied to a NOR gate 62. The output from the NOR gate 62 is applied to the inverted OR gate 63 as the other input thereto and the output of the inverted OR gate 63 is applied to these two shift registers 59 and 60 as a shift clock pulse. The output of the last stage bit cell T9 of the shift register 59 is applied through an inverter 65 to a read only memory 66 (FIG. 10B) serving as a display decoder. The read only memory 66 is supplied with six bit outputs D4 through D9 of the shift register 60 in a parallel fashion. Electrical connection at each intersection between the column and row signal lines of the read only memory 66 as well as the above described read only memory 38 is shown in detail in FIGS. 11A and 11B. More specifically, electrical connection at the intersection represented by a single circle is shown in FIG. 11A and electrical connection at the intersection represented by double circles is shown in FIG. 11B. The read only memory 66 is structured to be responsive to the bit parallel outputs of six bits of the shift register 60 and the output of one bit of the shift register 59 to provide a segment selecting signal for selecting the segments arranged in the shape of the numeral "8" as shown in FIG. 19A for displaying any one of ten Arabic numeral characters 0, 1, 2, . . . 9 through selective energization of segments by way of a combination of selected segments. Display of numeral characters using an arrangement of segments in the shape of numeral "8" through selective energization of segments is well known to those skilled in the art. Correlation between the input signals and the output signals of the read only memory 66 is shown in Table 7.

Referring to Table 7, let it be assumed that the bit cells D4 through D9 of the shift register 60 assume the logic combination "000001" and the bit cell T9 of the shift register 59 assumes the logic zero. Then only the outputs b and c become the logic one while the remaining outputs assume a logic zero, thereby to provide the segment selection signal representing Channel "1". Accordingly, referring to FIG. 19A, only the segments 67b and 67c out of the segments arranged in the numeral shape "8" is energized to emit light, thereby to display the character of numeral "1".

Figure 12:
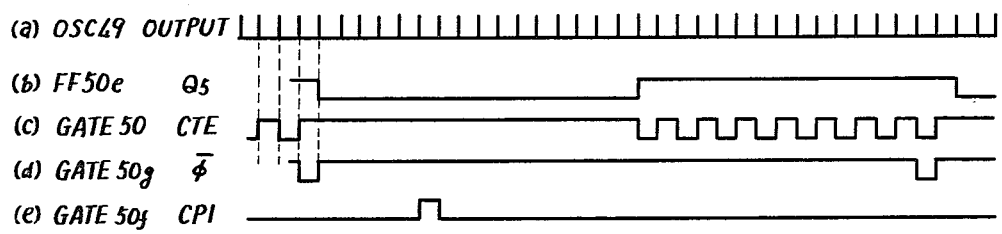
FIGS. 12 through 18 are timing charts for explaining the operation of the embodiment.

Before detailed description will be made of the operation of the embodiment shown, description will be made of the operation of the timing signal generator 50. The oscillator 49 generates a pulse of the period as shown in FIG. 12. Accordingly, the outputs Q1, Q2, Q3, Q4 and Q5 of the flip-flops 50a, 50b, 50c, 50d and 50e in the timing signal generator 50 become as shown in FIG. 13. Therefore, the output of the NAND gate 50g receiving these outputs Q1 through Q5 becomes as shown in FIG. 12, wherein a clock $\bar{\phi}$ of the width of one cycle of the pulse output from the oscillator 49 is obtained at the end of the output Q5. The clock $\bar{\phi}$ is inverted by an inverter and is withdrawn as a clock $\phi$ as shown in FIG. 13. These clocks $\bar{\phi}$ and $\phi$ are utilized to control the timing relation of various portions in the control circuit 31. The output of the inverted OR gate 50f receiving an inversion of the output Q1, the output Q2, an inversion of the output Q3, the output Q4 and the output Q5 of the flip-flops 50a through 50e, respectively, is withdrawn as a signal CPI as shown in FIG. 12. The signal CPI is applied through a NAND gate 56b of the parallel/serial control circuit 56 to the parallel/serial converter 37 as a signal PI. The output Q1 of the flip-flop 50a is applied to the clock terminal of the delay flip-flop 36, as described previously. It is pointed out that the time axis in the timing charts referred to in the present specification are not necessarily of the same scale, although the timing relation can be clearly understood by comparing the signals with the basic clocks $\phi$ and $\bar{\phi}$.

Now, the operation of the embodiment shown will be described in detail in the following. It is pointed out that the following description will be made in accordance with the convention of the zero active logic or negative logic.

If and when a power switch, not shown, is turned on, the initial signal $\overline{INIT}$ becomes the logic zero. Accordingly, the flip-flop 41a in the buffer 41 is set and the flip-flops 40a, 42a and 45a in the buffers 40, 42 and 45 are reset. At the same time, the delay flip-flop 36 is reset responsive to the initial signal INIT. Therefore, the output Q of the flip-flop 41a, i.e. the signal U/D becomes a logic one. Therefore, only the output J1 of the jam data circuit 33 becomes a logic one and the output of logic combination "100000" is obtained from the outputs J1 through J6.

On the other hand, the flip-flops 50a through 50f of the timing signal generator 50 are reset responsive to the initial signal INIT. Thereafter, the flip-flop 50a is triggered responsive to the first pulse obtained from the oscillator 49, as shown in FIG. 12 (a), and the output Q1 is withdrawn as a logic one. The delay flip-flop 36 is set responsive to the initial signal INIT and the output Q of a flip-flop 36 becomes the logic one responsive to the clock CL obtained from the output Q1 of the flip-flop 50a of the timing signal generator 50. The logic one signal from the output Q of the delay flip-flop 36 is applied to the up down counter 32 as preset enable signal PE. Therefore, the up down counter 32 is preloaded with the data representative of Channel 1 obtained from the jam data circuit 33. More specifically, the flip-flops 32a through 32f of the up down counter 32 as shown in FIG. 6 are set responsive to the signals J1 through J6 and the outputs Q1 through Q6 and thus the outputs PQ1 through PQ6 are withdrawn in the form of logic combination "100000".

Thereafter, a pulse train is generated in succession from the oscillator 49 and the flip-flops 50a through 50e of the timing signal generator 50 are in succession triggered and a basic clock signal $\bar{\phi}$ as shown in FIG. 12 (d) is withdrawn. The signal CPI as shown in FIG. 12 (e) is obtained as a logic one from the inverted OR gate 50f of the timing signal generator 50. The signal CPI is applied through the parallel/serial control circuit 56 to the parallel/serial converter 37 as shown in FIG. 7 as a signal $\overline{PI}$. Accordingly, the signal PI of the parallel/serial converter 37 becomes a logic zero and the flip-flops 37a through 37f are enabled.

On the other hand, the parallel/serial converter 37 is supplied with the clock signal TC as shown in FIG. 15(b) from the inverted OR gate 56a receiving the output Q5 of the flip-flop 50e in the timing signal generator 50. The timing signal TC is obtained in one clock period $\bar{\phi}$ through $\phi$. Therefore, the parallel/serial converter 37 is responsive to the signal TC to convert the data "100000" obtained in a bit parallel fashion from the multiplexer 35 into a serial data signal DATA.

The data "100000" from the multiplexer 35 is also applied to the read only memory 38. Accordingly, as understood from Table 6 discussed previously, the output data "100000110" is obtained from the outputs $\overline{D1}$ through $\overline{D9}$ of the read only memory 38. The output data from the read only memory 38 is applied to the programmable counter 18. Therefore, the frequency signal generator P is controlled to provide the frequency signals $f_R$, $f_r$ and $f_T$ so as to correspond to Channel 1.

Figure 16:
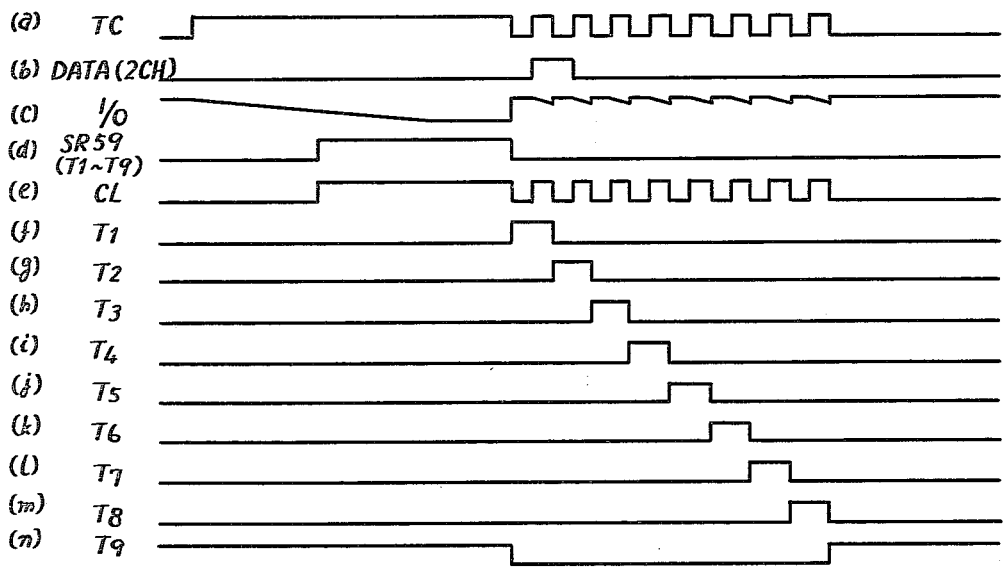

On the other hand, the signals DATA and TC from the parallel/serial converter 37 are applied to the display D as shown in FIGS. 10A and 10B. The signal TC as shown in FIG. 16 (a) is applied through the inverter to the metal oxide semiconductor field effect transistor 61, whereby the field effect transistor 61 is turned on. Accordingly, the output electrode i.e. the terminal I/O, of the field effect transistor 61 assumes a low level. Since the operation threshold value of the inverter 58 has been properly selected, the signal as shown in FIG. 16 (d) is obtained as the output from the inverter 58 and thus as the input IN of the shift register 59. If and when the signal as shown in FIG. 16 (d) is applied to the shift register 59, a logic one is loaded in the first bit position T1 and accordingly the logic zero is obtained from the NOR gate 64 while a logic one is obtained from the NOR gate 62 and thus from the inverted OR gate 63 for the time period of the signal as shown in FIG. 16 (d). The output of the inverter 58 is applied through the NOR gate 62 to the inverted OR gate 63. Accordingly, the signal CL as shown in FIG. 16 (e) is obtained from the inverted OR gate 63.

At that time, the bit serial signal DATA "100000" is applied from the parallel/serial converter 37 through the inverter 57 to the input IN of the shift register 60. If and when the ninth pulse of the signal CL is received, it follows that the bit positions D9 through D4 of the shift register 60 have been loaded with the data "100000". The terminals IN and CL of the shift register 59 are also supplied with the signal, so that the shift register 59 makes a shifting operation. However, the last bit T9 of the shift register 59 becomes a logic zero if and when the other bit positions T1 through T8 become a logic one. The signal from the bit position T9 is inverted by means of the inverter 65 and is applied to the read only memory 66 as an inhibit signal. More specifically, if and when the signal from the inverter 65 becomes a logic one, the field effect transistor as shown in FIG. 11B of the read only memory 66 (FIG. 10B) becomes non-conductive, whereby the segment selecting signal is inhibited from being applied from the read only memory 66 to the display 67 (FIG. 19A). If and when the bit position T9 of the shift register 59 becomes a logic one, the above described inhibit signal is released and the relevant segments of the display 67 are caused to emit light. This is designed to prevent flickering of the display 67 that could occur during the time period when a channel is selected and the signal DATA is transferred from the parallel/serial converter 37.

Even if a signal is applied to the terminal TC, no signal is not immediately applied to the clock terminal CL of the shift registers 59 and 60. More specifically, if and when the signal TC is received, the signal TC is applied through the inverter to the field effect transistor 61. Accordingly, the field effect transistor 61 is turned off and the electric charge as stored so far in the capacitor 61a is discharged, whereby the voltage at the terminal I/O decreases in accordance with a prescribed discharging curve as shown FIG. 16 (c). Since one input of the NOR gate 62 is initially the logic zero, the input terminal of the inverted OR gate 63 become the logic one. Accordingly, even if the inverted OR gate 63 is supplied with the signal TC at the other input, the signal CL is not obtained. After the electric charge in the capacitor 61a is discharged and the input of the NOR gate 62 becomes a logic one, the input of the inverted OR gate 63 becomes a logic zero and the clock signal corresponding to the signal TC as shown in FIG. 16 (e) is applied to the terminal CL. Therefore, the shift register 59 makes a shifting operation and at the following instance any one of the bit positions T1 through T8 becomes a logic one, whereby the input terminal of the NOR gate 62 becomes a logic one. At that time, one input of the inverted OR gate 63 becomes a logic zero irrespective of the signal level of the capacitor 61a, so that the signal TC is immediately applied to the terminal CL. This is because malfunction of these shift registers 59 and 60 by virtue of noise of a pulse width narrower than the signal TC is prevented.

The read only memory 66 receives the data at the bit positions D9 through D4, whereby only the outputs b and c become a logic one, as understood from Table 7. Therefore, only the segments 67b and 67c shown in FIG. 19A are energized to emit light, whereby the numeral "1" representing Channel 1 is displayed. Thus, the transceiver of the embodiment shown selects Channel 1 responsive to turning on of the power supply.

Now that the initial state of the transceiver was described in the foregoing, various operation modes of the inventive transceiver will be described in detail in the following.

INDIVIDUAL CHANNEL SELECTION MODE

Figure 14:
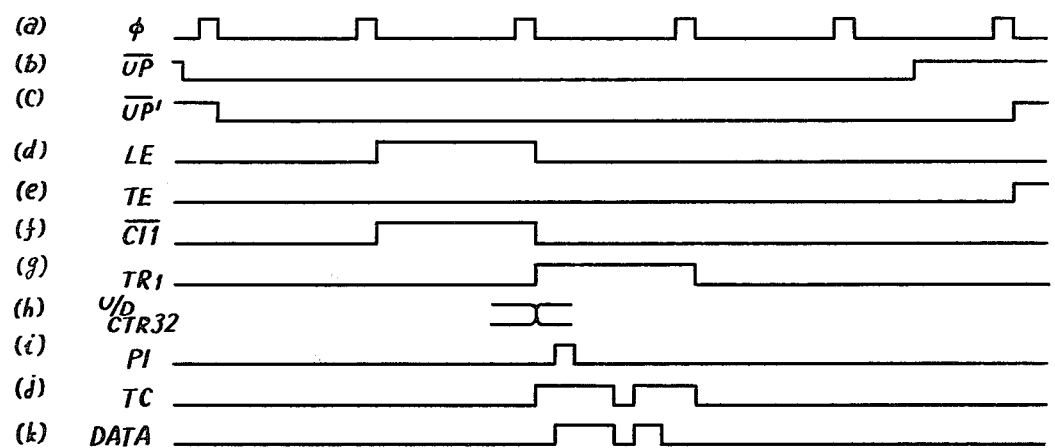

At the outset, individual channel selection in the upward direction is described. Let it be assumed that an operator depresses the upward scanning switch 27 in the above described initial state. Accordingly, the signal $\overline{UP}$ is applied to the control circuit 31 as a logic zero. Therefore, the input terminal D of the flip-flop 41a in the buffer 41 becomes a logic one and the output Q becomes the logic one. Therefore, the signal $\overline{UP'}$ becomes a logic zero as shown in FIG. 14 (c) and is applied through the NOR gate 46 to the edge extracting circuit 48. Accordingly, the outputs Q of the flip-flops 48a and 48b of the edge extracting circuit 48 both become a logic zero and the output of the inverted OR gate 48c of the circuit 48 becomes a logic zero. The output of the inverted OR gate 48c is applied to the inverter 53e of the step/transfer control circuit 53. Accordingly, the output signal CI1 of the inverted AND gate 53f of the step/transfer control circuit 53 becomes a logic one as shown in FIG. 14 (f). The signal $\overline{CI1}$ is applied through the inverted AND gate 55 to the terminal CI of the up down counter 32, whereby the terminal CI becomes a logic zero. Therefore, the terminal TE1 of the first stage flip-flop 32a of the up down counter 32 becomes a logic one. Therefore, the up down counter 32 is enabled.

On the other hand, the clock signal $\bar{\phi}$ as shown in FIG. 12 (d) is obtained in succession from the timing signal generator 50 and when the clock signal $\bar{\phi}$ falls the logical state of the output terminals Q1 and $\overline{Q1}$ is reversed, as shown in the truth table of Table 3, whereby the terminal PQ1 is reversed of the logical state from a logic one, if so far assumed. to a logic zero. At that timing, the output of the inverted OR gate 32i becomes a logic one and the terminal TE2 of the next stage flip-flop 32b becomes a logic zero. Therefore, if and when the signal $\phi$ applied to the terminal CL of the up down counter 32 falls, the logical state of the outputs Q2 and $\overline{Q2}$ of the flip-flop 32b is also reversed, whereby the terminal PQ2 is reversed of the logical state from a logic zero, if so far assumed, to a logic one. Since the logic state of the terminals TE3 through TE6 remains a logic zero, the remaining flip-flops 32c through 32f maintain the same logic state. In other words, the up down counter 32 makes a counting operation responsive to each operation of the switch 27, as to be shown in more detail in TAble 8.

Table 8

| Terminal | PQ1 | PQ2 | PQ3 | PQ4 | PQ5 | PQ6 |
|---|---|---|---|---|---|---|
| Initial State | 1 | 0 | 0 | 0 | 0 | 0 |
| One Signal to Terminal $\overline{UP}$ | 0 | 1 | 0 | 0 | 0 | 0 |
| Two Signals to Terminal $\overline{UP}$ | 1 | 1 | 0 | 0 | 0 | 0 |
| Three Signals to Terminal $\overline{UP}$ | 0 | 0 | 1 | 0 | 0 | 0 |

As seen from Table 8, each time the signal UP becomes the logic one and the signal $\overline{UP}$ becomes the logic zero, the count value in the up down counter 32 increases by one. The output of a up down counter 32 as renewed by each operation of the switch 27 is applied to the multiplexer 35. Unless either the press-to-talk switch 29 or the emergency switch 26 is turned on, the output signal CHS of the program channel output decision circuit 52 remains the logic zero and the multiplexer 35 serves to provide the outputs PQ1 through PQ6 of a up down counter 32 to the output terminals DP1 through DP6.

Figure 15:
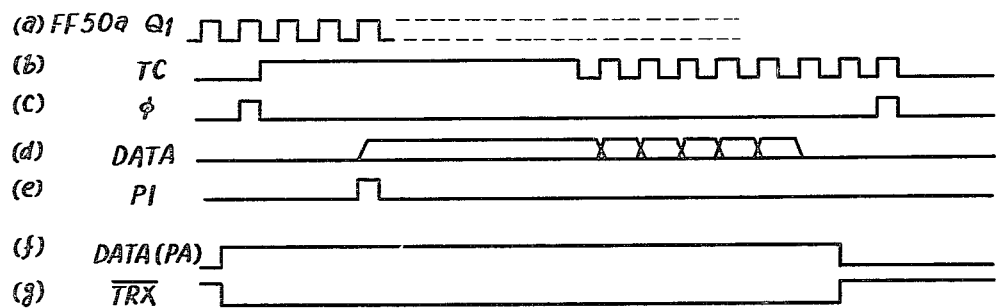

On the other hand, the parallel/serial converter 37 is supplied with the data from the multiplexer 35 at the input terminals DP1 through DP6. Thus the terminals P/S of the flip-flops 37a through 37f constituting the parallel/serial converter 37 are supplied with the signal $\overline{PI}$ as shown in FIG. 15 (e). The signal $\overline{PI}$ becomes a logic one if and when both the signal $\overline{TR1}$ of the output Q of the flip-flop 53g in the step/transfer control circuit 53 and the input of the inverted OR gate 50f of the timing signal generator 50 become a logic zero. The flip-flops 37a through 37f are supplied with the signal TC as shown in FIG. 15 (b) at the terminals CL. Accordingly, in a case where the terminals CL turns from a logic one to the logic zero when a terminals D1 through D6 of the flip-flops 37a through 37f are the logic zero and the terminals P/S are a logic one, the outputs Q1 through Q6 becomes a logic zero. On the other hand, in case where the signal $\overline{CL}$ turns from a logic one to a logic zero when the outputs Q1 through Q6 are a logic one and the terminal P/S is the logic one, the outputs Q1 through Q6 of the flip-flops 37a through 37f becomes a logic one. Therefore, depending on whether the output of a preceding flip-flop is a logic one or a logic zero, the output of the succeeding flip-flop becomes a logic one or a logic zero. The signal TR1 from the flip-flop 53g of the step/transfer control circuit 53 is utilized to transfer the renewed data with a delay of one clock time period, when the count value in the up down counter 32 is renewed.

The signal PI applied to the terminal P/S of the parallel/serial converter 37 is, as shown in FIG. 13 (g) or FIG. 15 (e), a logic zero at the beginning and accordingly the signal $\overline{PI}$ is a logic one. Thereafter the signal PI becomes a logic one, when the signal $\overline{PI}$ becomes a logic zero and the data from the multiplexer 35 is written in the parallel/serial converter 37 through the terminals DP1 through DP6. When the signal TC becomes a logic one and the signal $\overline{TC}$ applied to the terminal CL becomes a logic zero, the outputs Q1 through Q6 of the flip-flops 37a through 37f also becomes a logic zero or a logic one, as described previously, and the output Q6 of the flip-flop 37f is applied as the signal DATA through the NOR gate 37g to the display D as shown in FIG. 15 (d).

The signal DATA will be described in more detail. Assuming that the data from the up down counter 32 is that for selecting channel 2, only the output Q5 of the flip-flop 37e is a logic one and only if and when the signal $\overline{TC}$ becomes a logic zero for the second time, the output Q6 of the flip-fop 37f becomes a logic one and the signal as shown in FIG. 15 (d) is obtained. Therefore, it follows that the data from the up down counter 32 is applied in a bit serial format from the parallel/serial converter 37 to the display D as the signal DATA. Accordingly, the display 67 in the display portion D displays the channel of the data in the up down counter 32, as described previously. At the same time, the read only memory 38 receives the data from the up down counter 32 to provide the frequency division data as shown in Table 6 to the programmable counter 18. Therefore, the frequency generator P is controlled such that the frequency signals $f_R$, $f_r$ and $f_T$ are generated so as to correspond to the channel represented by the above described frequency division data i.e. the data in the up down counter 32.

Now individual channel selection in the downward direction will be described in the following. If and when the downward scanning switch 29 is turned on after the power supply is turned on, the signal DN becomes a logic one and the signal $\overline{DN}$ becomes a logic zero. The signal $\overline{DN}$ of a logic zero is applied to the buffer 40 and the flip-flop 40a is set. Accordingly, the output Q thereof becomes a logic one and the output of the NOR gate 46 becomes a logic zero. Accordingly, the outputs Q of the flip-flops 48a and 48b in the edge extracting circuit 48 both becomes a logic zero and the output of the inverted OR gate 48c becomes a logic zero. Therefore, the output of the inverter 53e in the step/transfer control circuit 53 becomes a logic one and the output of the inverted AND gate 53f becomes a logic one. The output signal $\overline{CI1}$ of the inverted AND gate 53f is applied through the inverted AND gate 55 to the terminal CI of the up down counter 32.

If and when the terminal TE1 of the first stage flip-flop 32a of the up down counter 32 becomes a logic one and the signal $\bar{\phi}$ applied to the terminal CL falls, the outputs Q1 and $\overline{Q1}$ of the flip-flop 32a are reversed and the output terminal PQ1 turns from a logic zero, if so far assumed, to a logic one. At that time, the flip-flop 41a in the buffer 41 remains set responsive to the termination of the signal INIT and the output Q of the flip-flop 41a is a logic zero. Accordingly, the signal applied to the terminal U/D of the up down counter 32 is also a logic zero. Therefore, the output of the NOR gate 32j of the up down counter 32 (FIG. 6) becomes a logic one and the terminal TE2 of the succeeding stage flip-flop 32b becomes a logic zero. Accordingly, the output Q2 of the flip-flop 32b is reversed from a logic zero, if so far assumed, to a logic one responsive to the fall of the signal $\bar{\phi}$. Therefore, the output of the inverted OR gate 32k also becomes a logic zero and the terminal TE3 of the succeeding stage flip-flop 32c also becomes a logic zero. Accordingly, the output Q3 of the flip-flop 32c turns from a logic one, if so far assumed, to a logic zero. However, since the terminal TE4 of the fourth stage flip-flop 32d remains a logic one, the output Q4 thereof and thus the terminal PQ4 remains the same even if the signal $\bar{\phi}$ falls. The change of the logical states in the up down counter 32 responsive to the operation of the switch 28 is shown in Table 9.

Table 9

| Terminal | PQ1 | PQ2 | PQ3 | PQ4 | PQ5 | PQ6 |
|---|---|---|---|---|---|---|
| Initial State | 0 | 0 | 1 | 0 | 0 | 0 |
| One Signal to Terminal $\overline{DN}$ | 1 | 1 | 0 | 0 | 0 | 0 |
| Two Signals to Terminal $\overline{DN}$ | 0 | 1 | 0 | 0 | 0 | 0 |
| Three Signals to Terminal $\overline{DN}$ | 1 | 0 | 0 | 0 | 0 | 0 |

It is seen from Table 9 that the up down counter 32 makes a down count operation each time the switch 28 is turned and the signal $\overline{DN}$ becomes the logic zero.

Meanwhile, unless either the switch 26 or 29 is turned on in this case again, it follows that the multiplexer 35 serves to provide the count value in a up down counter 32. Therefore, a further description will be the same as previously described and will be omitted.

SCAN MODE

When the switch 27 or 28 is kept depressed in the above described individual channel selection mode, the control circuit 31 is kept supplied with the signal UP or DN, respectively, whereby the signal from the NOR gate 48d in the edge extracting circuit 48 becomes a logic zero and the reset terminals R of the flip-flops 51a through 51e of the stepping pulse generator 51 become a logic zero. Therefore, the operation of these flip-flops 51a through 51e is initiated. More specifically, these flip-flops 51a through 51e are triggered with the output Q5 of the flip-flop 50e of the timing signal generator 50 and thus with the basic pulse FIG. 12 (a) from the oscillator 49. As a result, the signal of the period T0 as shown in FIG. 17 (c) is obtained from the inverted OR gate 51e receiving an inversion of the output Q6 of the flip-flop 51a and the output Q7 of the flip-flop 51b and is applied as one input to the NAND gate 53d of the step/transfer control circuit 53. At that time, the signal of the period 8T0 as shown in FIG. 17 (b) is obtained from the NAND gate 51g receiving the outputs Q7 through Q10 of the flip-flops 51b through 51e. Therefore, the output $\overline{Q}$ of the flip-flop 53c in the step/transfer control circuit 53 and thus the signal SCAN becomes a logic one for the period of the period 8T0, which is applied to the NAND gate 53d. Accordingly, the signal CI1 as shown in FIG. 17 (d) is obtained from the NAND gate 53d and thus from the inverted AND gate 53f after the lapse of the period 8T0. The signal $\overline{CI1}$ is applied to the input CI of the up down counter 32, as described previously. Therefore, the up down counter 32 is responsive to the signal $\overline{CI1}$ to make a consecutive counting operation. If and when the input terminal U/D of the up down counter 32 is a logic one, then the up down counter 32 operates as an up counter, whereas if the input terminal U/D is a logic zero, then the up down counter 32 operates as a down counter.

The up down counter 32 continues a counting operation in the upward direction, and if and when the count value in the up down counter 32 exceeds the value corresponding to the Channel 40, the inhibit signal $\overline{IHBIT}$ of a logic zero is obtained from the read only memory 38, whereby the delay flip-flop 36 is reversed of the state. Accordingly, the output Q of the delay flip-flop 36 becomes a logic one and the signal TE is applied to the up down counter 32. Accordingly, the up down counter 32 is preloaded with the data from the jam data circuit 33 at this timing, and thus the data corresponding to the Channel 1 in case of an up count mode when the signal U/D is a logic one, whereupon the scanning operation is initiated starting from the Channel 1. Assuming the up down counter 32 is in the down count mode, the inhibit signal $\overline{IHBIT}$ of a logic zero is obtained similarly from the read only memory 38 when the value in the up down counter 32 exceeds the value corresponding to Channel 1, and the up down counter 32 is preloaded with the data corresponding to Channel 40 obtained from the jam data circuit 33. However, in this case, the scanning operation is initiated starting from Channel 40. Such scanning operation is repeated until the switch 27 or 28 is turned off and the signal UP or DN becomes the logic zero.

Now description will be made of an automatic search mode which is one of the essential features of the present invention.

AUTOMATIC SEARCH MODE

In the automatic search mode, the upward scanning switch 27 and the downward scanning switch 28 are simultaneously turned on in accordance with the feature of the present invention. Accordingly, both the signals UP and DN applied to the control circuit 31 become a logic one and the flip-flops 41a and 40a in the buffers 41 and 40, respectively, are both set. Therefore, the signal LE is obtained from the inverted OR gate 48c of the edge extracting circuit 48 and is applied through the inverter 53e of the step/transfer control circuit 53 to the inverted AND gate 53f. Accordingly, the said signal $\overline{CI1}$ is obtained from the inverted AND gate 53f and the up down counter 32 is caused to start a counting operation as described in conjunction with the individual channel selection mode. Since the signal U/D of the up down counter 32 is a logic one at that time, the up down counter 32 makes an upward counting operation.

Unless the switch 26 or 29 is turned on, the signal CHS is a logic one and the multiplexer 35 transfers the data from the up down counter 32.

Figure 18:
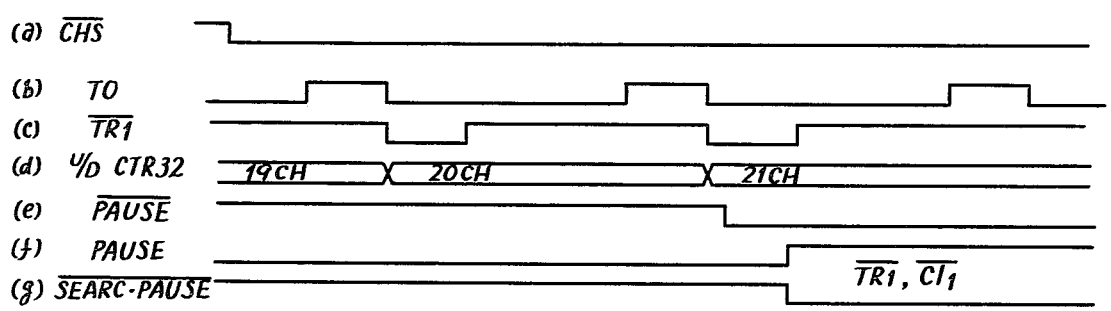

Since the signals TI and TC are applied to the parallel/serial converter 37 as well, the bit serial channel data signal DATA is obtained from the converter 37 in the same manner as described previously and is displayed by the display D. At the same time, the frequency division rate in the frequency signal generator P is controlled responsive to the data represented by the outputs D1 through D9 of the read only memory 38 and the channel is renewed in the same manner. Thus, such operation is repeated by the signal of the period T0 shown in FIG. 18 (b) during the time period when the signals $\overline{UP}$ and $\overline{DN}$ are a logic zero. Thus, if and when the signals $\overline{UP}$ and $\overline{DN}$ both are a logic zero, the outputs Q of the flip-flops 41a and 40a both are a logic one, and a logic zero output is obtained from the NAND gate 47, which is applied to the inverted AND gate 53a and the inverter 53h of the step/transfer control circuit 53. Accordingly, the output of the inverter 53h is applied to the NAND gate 53i as a logic one. If and when a communicating channel or a vacant channel is detected in such a situation and the signal PAUSE becomes the logic one while the signal $\overline{PAUSE}$ becomes a logic zero, the flip-flop 44a of the buffer 44 is set and the output Q of the flip-flop 44a becomes a logic one, which is applied to the NAND gate 53i as the other input thereto. Therefore, the output of the NAND gate 53i becomes a logic zero and one input to the NAND gate 53d becomes a logic zero, whereby the output of the NAND gate 53d becomes a logic one irrespective of the logical state of the other input thereto. Therefore, the output of the inverted AND gate 53f and thus the signal $\overline{CI1}$ is always a logic one and the input CI of the up down counter 32 becomes a logic zero. In other words, when the signal PAUSE is applied, the up down counter 32 is caused to stop a counting operation and the frequency signal generator P is maintained in the state of the channel selected at that time. Thus, the automatic search mode is achieved as shown in FIG. 18. Referring to FIG. 18, in the example shown, since Channels 19 and 20 lack a communication signal, a counting operation is continued in these channels, but sincea communication signal exists in Channel 21, the up down counter 32 keeps the state as achieved, when Channel 21 is attained.

TRANSMISSION MODE

It is not desired that a channel is renewed in the transmission mode, since an undesired electric wave is transmitted on the occasion of channel transition. According to another feature of the present invention, therefore, a counting operation in the up down counter 32 is disabled in the transmission mode.

More specifically, if and when the press-to-talk switch 29 is turned on for the purpose of transmission mode, the signal TXI of a logic one is applied to the control circuit 31. Therefore, the output Q of the flip-flop 42a of the buffer 42 becomes a logic one and is applied to the program channel output decision circuit 52. Accordingly, the output $\overline{CI2}$ of the NOR gate 52a which was so far a logic one becomes a logic zero and the output $\overline{CI2}$ of a logic zero is applied through the NAND gate 55 to the input CI of the up down counter 32. Therefore, the up down counter 32 is locked so that the count value is not renewed any more even if the switch 27 or 28 is turned on.

The output signal $\overline{CI2}$ from the NOR gate 52a is applied to the NAND gate 53b of the step/transfer control circuit 53. Therefore, the succeeding stage flip-flop 53c is reversed of the state and the signal SCAN from the output $\overline{Q}$ thereof becomes a logic zero while the output signal $\overline{CI1}$ of the inverted AND gate 53f becomes a logic one. Thus, the step/transfer control circuit 53 also inhibits the counting operation of the up down counter 32.

Since the signal $\overline{CI2}$ becomes a logic one, the flip-flop 52d in the program channel output decision circuit 52 is reversed in state. Accordingly, the output of the NOR gate 52e becomes a logic zero and the output signal $\overline{TR3}$ of the exclusive OR gate 52g also becomes a logic zero, whereby the output of the inverted OR gate 56a of the parallel/serial control circuit 56 and thus the signal TC becomes active. Accordingly, the parallel/serial converter 37 is inhibited from making a shifting operation, whereby the signal DATA from the converter 37 is maintained. The display D displays the channel as attained when the press-to-talk switch 29 is turned on. Similarly, the read only memory 38 continues to provide the frequency division data corresponding to the channel thus attained. Thus, change of the channel is inhibited in the transmission mode, whereby radiation of an undesired electric wave is avoided.

EMERGENCY MODE

If and when the emergency switch 26 is turned on, the signal CH9 applied to the control circuit 31 becomes a logic one and the output from the buffer 43 becomes a logic one, which is applied to the program channel output decision circuit 52. Accordingly, the output of the inverted OR gate 52a in the program channel output decision circuit 52 and thus the signal $\overline{CI2}$ becomes a logic zero. Therefore, as in the same manner as described in conjunction with the transmission mode, the up down counter 32 is caused to stop a counting operation. Since the signal $\overline{CI2}$ becomes a logic zero, the output Q of the flip-flop 52d and thus the signal CHS becomes a logic one. Accordingly, the multiplexer 35 is switched such that the data from the Channel 9 storing circuit 34 is obtained. More specifically, the data "100100" from the Channel 9 storing circuit 34 is obtained from the output terminals DP1 through DP6. Since the above described data is for Channel 9 for emergency purpose, the data "110100110" representing Channel 9 is obtained from the output terminals D1 through D9 of the read only memory 38 and the frequency signal generator P is set to Channel 9. The data from the multiplexer 35 is applied to the parallel/serial converter 37 in the same manner as described previously and the bit serial channel data signal DATA is obtained therefrom responsive to the signal $\overline{TR3}$. Therefore, the numeral "9" is displayed in the display 67 (FIG. 19A) in the display portion D. The signal $\overline{TR3}$ from the exclusive OR gate 52d of the program channel output decision circuit 52 is used as a signal of one clock period for the purpose of transferring the data from the parallel/serial converter 37 to the display D when the emergency switch 26 is turned on.

PUBLIC ADDRESS MODE

For the purpose of using the amplifier in the inventive transceiver as a public address system, the switch 30 is turned on. Accordingly, the signal PA applied to the control circuit 31 becomes a logic one and the flip-flop 45a in the buffer 45 is set. Therefore, the output Q of the flip-flop 45a and thus the signal PA is obtained as a logic one and the flip-flop 54a of the edge extracting circuit 54 is set. Accordingly, the output $\overline{Q}$ of the flip-flop 54a becomes a logic zero. Therefore, two inputs to the exclusive OR gate 54b both a logic zero and the output signal $\overline{TR2}$ becomes a logic zero. The output signal $\overline{TR2}$ of the exclusive OR gate 54b of the edge extracting circuit 54 is a signal of one clock period used for transferring the display data in the public address mode and is applied through inverted AND gate 56c and NAND gate 56b of the parallel/serial control circuit 56 to the parallel/serial converter 37. Accordingly, when the signal TC is applied, the display data signal DATA of the parallel/serial converter 37 is obtained as the public address mode data "111111" (see Table 7) as shown in FIG. 15(f). Accordingly, all the bit positions D4 through D9 of the shift register 60 in the display D become a logic one, as shown in Table 7, the terminals 10a, 10b, 10e, 10f and 10g and a, b, c, e, f and g of the read only memory 66 serving as a display decoder becomes a logic one, while the remaining terminals becomes a logic zero. Therefore, the display 67 of the display portion D is supplied with a segment selection signal representing selection of the segments for displaying the characters "PA", as shown in FIG. 19B, through light emission from the corresponding segments.

The signal PA from the buffer 45 is applied through the inverted AND gate 55 to the input CI of the up down counter 32. Therefore, the input CI becomes a logic zero and the up down counter 32 is inhibited from making a counting operation while the counter 32 maintains the data attained immediately before the switch 30 is turned on. In other words, if and when the switch 30 is turned on, the up down counter 32 maintains the state immediately before that.

As seen from Table 2, the control circuit 31 is not responsive to the other signals CH9, UP, DN, TX1 and PAUSE. In other words, according to the embodiment shown, the public address mode can be set in preference to the other operation modes.

Although the present invention has been described and illustrated in detail, it is to be clearly understood that the same is by way of illustration and example only and is not to be taken by way of limitation, the spirit and scope of the present invention being limited only by the terms of appended claims.

Table 2

| Input | | | | | | Output | | | |
|---|---|---|---|---|---|---|---|---|---|
| | | | | | | Display | Frequency Division | Contents in Up Down | |
| PA | TX1 | CH9 | UP | DN | PAUSE | Data | Data | Counter (32) | Remarks |
| 1 | X | X | X | X | X | PA | Hold | Hold | |
| 0 | 1 | X | X | X | X | Hold | Hold | Hold | |
| 0 | 0 | 1 | X | X | X | 9 | CH9 | Hold | |
| 0 | 0 | 0 | 1 | 0 | X | N | CHN | N | Note 1 |

Table 2-continued

| Input | | | | | | Output | | Contents in | |
|---|---|---|---|---|---|---|---|---|---|
| | | | | | | Display | Frequency Division | Up Down | |
| PA | TX1 | CH9 | UP | DN | PAUSE | Data | Data | Counter (32) | Remarks |
| 0 | 0 | 0 | 0 | 1 | X | N | CHN | N | Note 2 |
| 0 | 0 | 0 | 0 | 0 | X | Hold | Hold | Hold | |
| 0 | 0 | 0 | 1 | 1 | 0 | N | CHN | N | Note 3 |
| 0 | 0 | 0 | 1 | 1 | 1 | Hold | Hold | Hold | |

X mark denotes "Don't care"

Table 6

| Input | | | | | | | Output | | | | | | | | | | |
|---|---|---|---|---|---|---|---|---|---|---|---|---|---|---|---|---|---|
| N1 | DP6 | DP5 | DP4 | DP3 | DP2 | DP1 | No | D9 | D8 | D7 | D6 | D5 | D4 | D3 | D2 | D1 | IHBIT |
| 1 | 0 | 0 | 0 | 0 | 0 | 1 | 193 | 0 | 1 | 1 | 0 | 0 | 0 | 0 | 0 | 1 | 1 |
| 2 | 0 | 0 | 0 | 0 | 1 | 0 | 194 | 0 | 1 | 1 | 0 | 0 | 0 | 0 | 1 | 0 | 1 |
| 3 | 0 | 0 | 0 | 0 | 1 | 1 | 195 | 0 | 1 | 1 | 0 | 0 | 0 | 0 | 1 | 1 | 1 |
| 4 | 0 | 0 | 0 | 1 | 0 | 0 | 197 | 0 | 1 | 1 | 0 | 0 | 0 | 1 | 0 | 1 | 1 |
| 5 | 0 | 0 | 0 | 1 | 0 | 1 | 198 | 0 | 1 | 1 | 0 | 0 | 0 | 1 | 1 | 0 | 1 |
| 6 | 0 | 0 | 0 | 1 | 1 | 0 | 199 | 0 | 1 | 1 | 0 | 0 | 0 | 1 | 1 | 1 | 1 |
| 7 | 0 | 0 | 0 | 1 | 1 | 1 | 200 | 0 | 1 | 1 | 0 | 0 | 1 | 0 | 0 | 0 | 1 |
| 8 | 0 | 0 | 1 | 0 | 0 | 0 | 202 | 0 | 1 | 1 | 0 | 0 | 1 | 0 | 1 | 0 | 1 |
| 9 | 0 | 0 | 1 | 0 | 0 | 1 | 203 | 0 | 1 | 1 | 0 | 0 | 1 | 0 | 1 | 1 | 1 |
| 10 | 0 | 0 | 1 | 0 | 1 | 0 | 204 | 0 | 1 | 1 | 0 | 0 | 1 | 1 | 0 | 0 | 1 |
| 11 | 0 | 0 | 1 | 0 | 1 | 1 | 205 | 0 | 1 | 1 | 0 | 0 | 1 | 1 | 0 | 1 | 1 |
| 12 | 0 | 0 | 1 | 1 | 0 | 0 | 207 | 0 | 1 | 1 | 0 | 0 | 1 | 1 | 1 | 1 | 1 |
| 13 | 0 | 0 | 1 | 1 | 0 | 1 | 208 | 0 | 1 | 1 | 0 | 1 | 0 | 0 | 0 | 0 | 1 |
| 14 | 0 | 0 | 1 | 1 | 1 | 0 | 209 | 0 | 1 | 1 | 0 | 1 | 0 | 0 | 0 | 1 | 1 |
| 15 | 0 | 0 | 1 | 1 | 1 | 1 | 210 | 0 | 1 | 1 | 0 | 1 | 0 | 0 | 1 | 0 | 1 |
| 16 | 0 | 1 | 0 | 0 | 0 | 0 | 212 | 0 | 1 | 1 | 0 | 1 | 0 | 1 | 0 | 0 | 1 |
| 17 | 0 | 1 | 0 | 0 | 0 | 1 | 213 | 0 | 1 | 1 | 0 | 1 | 0 | 1 | 0 | 1 | 1 |
| 18 | 0 | 1 | 0 | 0 | 1 | 0 | 214 | 0 | 1 | 1 | 0 | 1 | 0 | 1 | 1 | 0 | 1 |
| 19 | 0 | 1 | 0 | 0 | 1 | 1 | 215 | 0 | 1 | 1 | 0 | 1 | 0 | 1 | 1 | 1 | 1 |
| 20 | 0 | 1 | 0 | 1 | 0 | 0 | 217 | 0 | 1 | 1 | 0 | 1 | 1 | 0 | 0 | 1 | 1 |
| 21 | 0 | 1 | 0 | 1 | 0 | 1 | 218 | 0 | 1 | 1 | 0 | 1 | 1 | 0 | 1 | 0 | 1 |
| 22 | 0 | 1 | 0 | 1 | 1 | 0 | 219 | 0 | 1 | 1 | 0 | 1 | 1 | 0 | 1 | 1 | 1 |
| 23 | 0 | 1 | 0 | 1 | 1 | 1 | 222 | 0 | 1 | 1 | 0 | 1 | 1 | 1 | 1 | 0 | 1 |
| 24 | 0 | 1 | 1 | 0 | 0 | 0 | 220 | 0 | 1 | 1 | 0 | 1 | 1 | 1 | 0 | 0 | 1 |
| 25 | 0 | 1 | 1 | 0 | 0 | 1 | 221 | 0 | 1 | 1 | 0 | 1 | 1 | 1 | 0 | 1 | 1 |
| 26 | 0 | 1 | 1 | 0 | 1 | 0 | 223 | 0 | 1 | 1 | 0 | 1 | 1 | 1 | 1 | 1 | |
| 27 | 0 | 1 | 1 | 0 | 1 | 1 | 224 | 0 | 1 | 1 | 1 | 0 | 0 | 0 | 0 | 0 | 1 |
| 28 | 0 | 1 | 1 | 1 | 0 | 0 | 225 | 0 | 1 | 1 | 1 | 0 | 0 | 0 | 0 | 1 | 1 |
| 29 | 0 | 1 | 1 | 1 | 0 | 1 | 226 | 0 | 1 | 1 | 1 | 0 | 0 | 0 | 1 | 0 | 1 |
| 30 | 0 | 1 | 1 | 1 | 1 | 0 | 227 | 0 | 1 | 1 | 1 | 0 | 0 | 0 | 1 | 1 | 1 |
| 31 | 0 | 1 | 1 | 1 | 1 | 1 | 228 | 0 | 1 | 1 | 1 | 0 | 0 | 1 | 0 | 0 | 1 |
| 32 | 1 | 0 | 0 | 0 | 0 | 0 | 229 | 0 | 1 | 1 | 1 | 0 | 0 | 1 | 0 | 1 | 1 |
| 33 | 1 | 0 | 0 | 0 | 0 | 1 | 230 | 0 | 1 | 1 | 1 | 0 | 0 | 1 | 1 | 0 | 1 |
| 34 | 1 | 0 | 0 | 0 | 1 | 0 | 231 | 0 | 1 | 1 | 1 | 0 | 0 | 1 | 1 | 1 | 1 |
| 35 | 1 | 0 | 0 | 0 | 1 | 1 | 232 | 0 | 1 | 1 | 1 | 0 | 1 | 0 | 0 | 0 | 1 |
| 36 | 1 | 0 | 0 | 1 | 0 | 0 | 233 | 0 | 1 | 1 | 1 | 0 | 1 | 0 | 0 | 1 | 1 |
| 37 | 1 | 0 | 0 | 1 | 0 | 1 | 234 | 0 | 1 | 1 | 1 | 0 | 1 | 0 | 1 | 0 | 1 |
| 38 | 1 | 0 | 0 | 1 | 1 | 0 | 235 | 0 | 1 | 1 | 1 | 0 | 1 | 0 | 1 | 1 | 1 |
| 39 | 1 | 0 | 0 | 1 | 1 | 1 | 236 | 0 | 1 | 1 | 1 | 0 | 1 | 1 | 0 | 0 | 1 |
| 40 | 1 | 0 | 1 | 0 | 0 | 0 | 237 | 0 | 1 | 1 | 1 | 0 | 1 | 1 | 0 | 1 | 1 |

Table 7

| Input | | | | | | | Output | | | | | | | | | | | | |
|---|---|---|---|---|---|---|---|---|---|---|---|---|---|---|---|---|---|---|---|
| | | | | | | | 10 | 10 | 10 | 10 | 10 | 10 | 10 | | | | | | |
| N | D4 | D5 | D6 | D7 | D8 | D9 | T9 | a | b | c | d | e | f | g | a | b | c | d | e | f | g |
| 1 | 0 | 0 | 0 | 0 | 0 | 1 | 0 | 0 | 0 | 0 | 0 | 0 | 0 | 0 | 1 | 1 | 0 | 0 | 0 | 0 |
| 2 | 0 | 0 | 0 | 0 | 1 | 0 | 0 | 0 | 0 | 0 | 0 | 0 | 0 | 0 | 1 | 1 | 0 | 1 | 1 | 0 | 1 |
| 3 | 0 | 0 | 0 | 0 | 1 | 1 | 0 | 0 | 0 | 0 | 0 | 0 | 0 | 0 | 1 | 1 | 1 | 1 | 0 | 0 | 1 |
| 4 | 0 | 0 | 0 | 1 | 0 | 0 | 0 | 0 | 0 | 0 | 0 | 0 | 0 | 0 | 0 | 1 | 1 | 0 | 0 | 1 | 1 |
| 5 | 0 | 0 | 0 | 1 | 0 | 1 | 0 | 0 | 0 | 0 | 0 | 0 | 0 | 0 | 1 | 0 | 1 | 1 | 0 | 1 | 1 |
| 6 | 0 | 0 | 0 | 1 | 1 | 0 | 0 | 0 | 0 | 0 | 0 | 0 | 0 | 0 | 1 | 0 | 1 | 1 | 1 | 1 | 1 |
| 7 | 0 | 0 | 0 | 1 | 1 | 1 | 0 | 0 | 0 | 0 | 0 | 0 | 0 | 0 | 1 | 1 | 1 | 0 | 0 | 0 | 0 |
| 8 | 0 | 0 | 1 | 0 | 0 | 0 | 0 | 0 | 0 | 0 | 0 | 0 | 0 | 0 | 1 | 1 | 1 | 1 | 1 | 1 | 1 |
| 9 | 0 | 0 | 1 | 0 | 0 | 1 | 0 | 0 | 0 | 0 | 0 | 0 | 0 | 0 | 1 | 1 | 1 | 1 | 0 | 1 | 1 |
| 10 | 0 | 0 | 1 | 0 | 1 | 0 | 0 | 0 | 1 | 1 | 0 | 0 | 0 | 0 | 1 | 1 | 1 | 1 | 1 | 1 | 0 |
| 11 | 0 | 0 | 1 | 0 | 1 | 1 | 0 | 0 | 1 | 1 | 0 | 0 | 0 | 0 | 0 | 1 | 1 | 0 | 0 | 0 | 0 |
| 12 | 0 | 0 | 1 | 1 | 0 | 0 | 0 | 0 | 1 | 1 | 0 | 0 | 0 | 0 | 1 | 1 | 0 | 1 | 1 | 0 | 1 |
| 13 | 0 | 0 | 1 | 1 | 0 | 1 | 0 | 0 | 1 | 1 | 0 | 0 | 0 | 0 | 1 | 1 | 1 | 1 | 0 | 0 | 1 |
| 14 | 0 | 0 | 1 | 1 | 1 | 0 | 0 | 0 | 1 | 1 | 0 | 0 | 0 | 0 | 0 | 1 | 1 | 0 | 0 | 1 | 1 |
| 15 | 0 | 0 | 1 | 1 | 1 | 1 | 0 | 0 | 1 | 1 | 0 | 0 | 0 | 0 | 1 | 0 | 1 | 1 | 0 | 1 | 1 |
| 16 | 0 | 1 | 0 | 0 | 0 | 0 | 0 | 0 | 1 | 1 | 0 | 0 | 0 | 0 | 1 | 0 | 1 | 1 | 1 | 1 | 1 |
| 17 | 0 | 1 | 0 | 0 | 0 | 1 | 0 | 0 | 1 | 1 | 0 | 0 | 0 | 0 | 1 | 1 | 1 | 0 | 0 | 0 | 0 |

Table 7-continued

| | Input | | | | | | | Output | | | | | | | | | | | | | |
|---|---|---|---|---|---|---|---|---|---|---|---|---|---|---|---|---|---|---|---|---|---|
| | | | | | | | | 10 | 10 | 10 | 10 | 10 | 10 | 10 | | | | | | | |
| N | D4 | D5 | D6 | D7 | D8 | D9 | T9 | a | b | c | d | e | f | g | a | b | c | d | e | f | g |
| 18 | 0 | 1 | 0 | 0 | 1 | 0 | 0 | 0 | 1 | 1 | 0 | 0 | 0 | 1 | 1 | 1 | 1 | 1 | 1 | 1 | 1 |
| 19 | 0 | 1 | 0 | 0 | 1 | 1 | 0 | 0 | 1 | 1 | 0 | 0 | 0 | 1 | 1 | 1 | 1 | 0 | 1 | 1 |
| 20 | 0 | 1 | 0 | 1 | 0 | 0 | 0 | 1 | 1 | 0 | 1 | 1 | 0 | 1 | 1 | 1 | 1 | 1 | 1 | 0 |
| 21 | 0 | 1 | 0 | 1 | 0 | 1 | 0 | 1 | 1 | 0 | 1 | 1 | 0 | 1 | 0 | 1 | 1 | 0 | 0 | 0 |
| 22 | 0 | 1 | 0 | 1 | 1 | 0 | 0 | 1 | 1 | 0 | 1 | 1 | 0 | 1 | 1 | 0 | 1 | 1 | 0 | 1 |
| 23 | 0 | 1 | 0 | 1 | 1 | 1 | 0 | 1 | 1 | 0 | 1 | 1 | 0 | 1 | 1 | 1 | 1 | 0 | 0 | 1 |
| 24 | 0 | 1 | 1 | 0 | 0 | 0 | 0 | 1 | 1 | 0 | 1 | 1 | 0 | 1 | 0 | 1 | 1 | 0 | 0 | 1 | 1 |
| 25 | 0 | 1 | 1 | 0 | 0 | 1 | 0 | 1 | 1 | 0 | 1 | 1 | 0 | 1 | 1 | 0 | 1 | 1 | 0 | 1 | 1 |
| 26 | 0 | 1 | 1 | 0 | 1 | 0 | 0 | 1 | 1 | 0 | 1 | 1 | 0 | 1 | 1 | 0 | 1 | 1 | 1 | 1 | 1 |
| 27 | 0 | 1 | 1 | 0 | 1 | 1 | 0 | 1 | 1 | 0 | 1 | 1 | 0 | 1 | 1 | 1 | 0 | 0 | 0 | 0 |
| 28 | 0 | 1 | 1 | 1 | 0 | 0 | 0 | 1 | 1 | 0 | 1 | 1 | 0 | 1 | 1 | 1 | 1 | 1 | 1 | 1 |
| 29 | 0 | 1 | 1 | 1 | 0 | 1 | 0 | 1 | 1 | 0 | 1 | 1 | 0 | 1 | 1 | 1 | 1 | 0 | 1 | 1 |
| 30 | 0 | 1 | 1 | 1 | 1 | 0 | 0 | 1 | 1 | 1 | 1 | 0 | 0 | 1 | 1 | 1 | 1 | 1 | 1 | 0 |
| 31 | 0 | 1 | 1 | 1 | 1 | 1 | 0 | 1 | 1 | 1 | 1 | 0 | 0 | 1 | 0 | 1 | 1 | 0 | 0 | 0 | 0 |
| 32 | 1 | 0 | 0 | 0 | 0 | 0 | 0 | 1 | 1 | 1 | 1 | 0 | 0 | 1 | 1 | 1 | 0 | 1 | 1 | 0 | 1 |
| 33 | 1 | 0 | 0 | 0 | 0 | 1 | 0 | 1 | 1 | 1 | 1 | 0 | 0 | 1 | 1 | 1 | 1 | 0 | 0 | 1 |
| 34 | 1 | 0 | 0 | 0 | 1 | 0 | 0 | 1 | 1 | 1 | 1 | 0 | 0 | 1 | 0 | 1 | 1 | 0 | 0 | 1 | 1 |
| 35 | 1 | 0 | 0 | 0 | 1 | 1 | 0 | 1 | 1 | 1 | 1 | 0 | 0 | 1 | 1 | 0 | 1 | 1 | 0 | 1 | 1 |
| 36 | 1 | 0 | 0 | 1 | 0 | 0 | 0 | 1 | 1 | 1 | 1 | 0 | 0 | 1 | 1 | 0 | 1 | 1 | 1 | 1 | 1 |
| 37 | 1 | 0 | 0 | 1 | 0 | 1 | 0 | 1 | 1 | 1 | 1 | 0 | 0 | 1 | 1 | 1 | 1 | 0 | 0 | 0 | 0 |
| 38 | 1 | 0 | 0 | 1 | 1 | 0 | 0 | 1 | 1 | 1 | 1 | 0 | 0 | 1 | 1 | 1 | 1 | 1 | 1 | 1 |
| 39 | 1 | 0 | 0 | 1 | 1 | 1 | 0 | 1 | 1 | 1 | 1 | 0 | 0 | 1 | 1 | 1 | 1 | 0 | 1 | 1 |
| 40 | 1 | 0 | 1 | 0 | 0 | 0 | 0 | 0 | 1 | 1 | 0 | 0 | 1 | 1 | 1 | 1 | 1 | 1 | 1 | 0 |
| PA | 1 | 1 | 1 | 1 | 1 | 1 | 0 | 1 | 1 | 0 | 0 | 1 | 1 | 1 | 1 | 1 | 1 | 0 | 1 | 1 | 1 |
| X | X | X | X | X | X | X | 1 | 0 | 0 | 0 | 0 | 0 | 0 | 0 | 0 | 0 | 0 | 0 | 0 | 0 | 0 |

What is claimed is:

1. A channel selecting apparatus for a superheterodyne receiver, comprising means for receiving a high frequency signal having a plurality of channels, local oscillating means for providing an oscillation frequency signal the frequency of which is different by a given frequency difference from said received high frequency signal, and mixing means responsive to said received high frequency signal and said local oscillation frequency signal for providing an intermediate frequency signal, said local oscillating means comprising voltage controlled oscillating means for providing an oscillation frequency signal the oscillation frequency of which is variable as a function of a given control voltage, means for modifying the oscillation frequency of the output of said voltage controlled oscillating means, first means for controlling the amount of frequency modification of said oscillation frequency modifying means to be determined for each of said plurality of channels, and means responsive to the output from said oscillation frequency modifying means, as controlled by said first means for providing a control voltage associated with the frequency of the output of said oscillation frequency modifying means to said voltage controlled oscillating means, whereby said local oscillating means is adapted to provide a local oscillation frequency signal the frequency of which is associated with the frequency modification rate, as controlled by said first means, said channel selecting apparatus further comprising upward scanning command means for commanding a scanning operation in the upward direction of said plurality of channels by said receiver, downward scanning command means for commanding a scanning operation in the downward direction of said plurality of channels by said receiver, said first means comprising means coupled to said oscillation frequency modifying means and responsive to the output of said upward scanning command means or said downward scanning command means to be enabled to make a reversible variation of the amount of frequency modification in the upward or downward scanning direction, respectively, the amount of frequency modification corresponding to the next adjacent channel, whereby a scanning operation is effected by said receiver on a one-by-one channel basis responsive to the output of said upward or downward scanning command means, and means responsive to the simultaneous outputs of both said upward scanning command means and said downward scanning command means for controlling said means for making reversible variation of the amount of frequency modification to make consecutive variations of the amounts of frequency modification in a given direction, whereby a scanning operation is effected by said receiver in a consecutive manner responsive to the simultaneous outputs of both said upward scanning command means and said downward scanning command means.

2. A channel selecting apparatus in a receiver in accordance with claim 1, in which said control voltage providing means comprises means for providing a reference frequency signal, and means responsive to the output of said oscillation frequency modifying means and the output of said reference frequency signal providing means for detecting the phase difference between the phase of the output of said oscillation frequency modifying means and the phase of said reference frequency signal for providing said control voltage to said voltage controlled oscillating means.

3. A channel selecting apparatus in a receiver in accordance with claim 2, in which said oscillation frequency modifying means comprises means for dividing the frequency of the output of said voltage controlled oscillating means, and said first means comprises means for controlling the ratio of frequency division by said frequency dividing means.

4. A channel selecting apparatus in a receiver in accordance with claim 3, wherein said frequency dividing means comprises programmable counter means.

5. A channel selecting apparatus in a receiver in accordance with claim 1, wherein said first means further comprises
   means responsive to the output of said upward scanning command means or said downward scanning command means for determining the output of said scanning command means being obtained for more than a predetermined time period, and
   means responsive to said determining means for controlling said means for making reversible variation of the amount of frequency modification to make consecutive variation of the amount of frequency modification in the corresponding upward or downward direction, whereby a scanning operation is effected by said receiver in a consecutive manner responsive to the output of said upward scanning command means or the output of said downward scanning means.

6. A channel selecting apparatus in a receiver in accordance with claim 1, which further comprises
   means for providing a signal representative of the receiving state by said receiver, and
   means responsive to said signal representative of the receiving state by said receiver for disabling said means for controlling said reversible variation means to make consecutive variation of the amount of frequency modification in a given direction, thereby to discontinue the variation of the amount of frequency modification at the value corresponding to the channel where the receiving state is established by said receiver.

7. A channel selecting apparatus in a receiver in accordance with claim 6, wherein said means for providing a signal representative of the receiving state by said receiver is adapted to provide a signal when a channel is detected wherein said high frequency signal is received.

8. A channel selecting apparatus in a receiver in accordance with claim 6, wherein said means for providing a signal representative of the receiving state by said receiver is adapted to provide a signal when a channel is detected wherein said high frequency signal is not received.

9. A channel selecting apparatus in a receiver in accordance with claim 1, wherein said means for making reversible variation of the amount of frequency modification comprises
   read only memory means coupled to said oscillation frequency modifying means and having a plurality of addresses for storing the respective frequency modification amounts each corresponding to said plurality of channels, and
   reversible addressing counter coupled to said read only memory means for addressing said read only memory means.

10. A channel selecting apparatus in a receiver in accordance with claim 9, wherein said reversible addressing counter is adapted to be responsive to the output of said upward scanning command means or the output of said downward scanning command means to be enabled to make an upward counting operation or a downward counting operation, respectively.

11. A channel selecting apparatus in a receiver in accordance with claim 10, wherein said first means further comprises
    means for producing count pulses of a given frequency,
    means responsive to the output of said upward scanning command means or said downward scanning command means for determining the output of said scanning command means being obtained for more than a predetermined time period, and
    means responsive to said determining means for providing said count pulses from said count pulse producing means to said reversible addressing counter for making a counting operation.

12. A channel selecting apparatus in a receiver in accordance with claim 11, wherein said means responsive to simultaneous outputs of both said upward scanning command means and said downward scanning command means is adapted to feed said count pulses to said reversible addressing counter for making a counting operation.

13. A channel selecting apparatus in a receiver in accordance with claim 1, which further comprises
    digital display means, and
    means for transferring the data concerning the amount of frequency modification in said means for making a reversible variation of the amount of frequency modification to said digital display means.

14. A channel selecting apparatus in a receiver in accordance with claim 13, wherein said data comprises a bit parallel coded signal, and
    said transfer means comprises parallel/serial converting means for converting said bit parallel coded signal into a bit series coded signal.

15. A channel selecting apparatus in a receiver in accordance with claim 14, which further comprises clock pulse source means, and in which said transfer means is adapted to transfer said bit series coded signal in synchronism with said clock pulses.

16. A channel selecting apparatus in a receiver in accordance with claim 15, wherein said digital display means comprises means responsive to said clock pulses for detecting a period for data transfer, and means responsive to said means for detecting a period for data transfer for disabling said digital display means.

17. A channel selecting apparatus in a receiver in accordance with claim 16, wherein said means for detecting a period for data transfer comprises
    integrating means for receiving said clock pulses,
    means coupled to said integrating means for threshold detecting the integrated value of said integrating means at a predetermined integrated value, and
    shift register means operable responsive to said clock pulses and for receiving the output from said threshold value detecting means.

18. A channel selecting apparatus in a receiver in accordance with claim 1, which further comprises specified channel selecting means for selecting a specified channel out of said plurality of channels, and in which said first means comprises means responsive to said specified channel selecting means for forcing said means for making reversible variation of the amount of frequency modification for forcing variation of the amount of frequency modification to the amount of frequency modification corresponding to said specified channel.

19. A channel selecting apparatus in a receiver in accordance with claim 18, in which said means for forcing said means for making reversible variation of the amount of frequency modification to the amount of frequency modification corresponding to said specified channel comprises means for storing the data concerning the amount of frequency modification corresponding to said specified channel, and multiplexing means responsive to said specified channel selecting means for selectively feeding said data concerning the amount of frequency modification corresponding to said specified channel to said means for making reversible variation of the amount of frequency modification.

20. A channel selecting apparatus in a receiver in accordance with claim 1, wherein said receiver comprises means for detecting said intermediate frequency signal for providing an audio signal, means coupled to said detecting means for amplifying said audio signal, and public address switching means for switching said audio signal amplifying means in public address mode.

21. A channel selecting apparatus in a receiver in accordance with claim 20, which further comprises means responsive to said public address switching means for disabling said means for making reversible variation of the amount of frequency modification, whereby variation of the amount of frequency modification is prevented when said audio signal amplifying means is switched in a public address mode.

22. A channel selecting apparatus in a receiver in accordance with claim 21, which further comprises digital display means coupled to said means for making reversible variation of the amount of frequency modification for displaying the data concerning the amount of frequency modification, and means responsive to said public address switching means for controlling said digital display means for displaying an indication representative of the public address mode.

23. A channel selecting apparatus in a receiver in accordance with claim 1, wherein said receiver further comprises transmitter coupled to said local oscillating means for obtaining a modulation signal from said local oscillating means, means for selectively enabling said receiver or said transmitter, and means responsive to said receiver/transmitter selecting means for selectively providing an oscillation frequency signal the oscillation frequency of which is different to said receiver or to said transmitter.

24. A channel selecting apparatus in a receiver in accordance with claim 23, which further comprises means responsive to said receiver/transmitter selecting means for disabling said means for making reversible variation of the amount of frequency modification when said transmitter is selectively enabled.

25. A channel selecting apparatus in a receiver in accordance with claim 24, which further comprises means for selecting a specificed channel, and means responsive to said receiver/transmitter selecting means for disabling said specified channel selecting means when said transmitter is selectively enabled.

26. A channel selecting apparatus in a receiver in accordance with claim 23, which further comprises means for providing a signal representative of the receiving state by said receiver, and means responsive to said signal representative of the receiving state by said receiver for disabling said means for controlling said reversible variation means to make consecutive variation of the amount of frequency modification in a given direction, thereby to discontinue the variation of said amount of frequency modification at the value corresponding to the channel where the receiving state is established by said receiver.

27. A channel selecting apparatus in a receiver in accordance with claim 26, wherein said means for providing a signal representative of the receiving state by said receiver is adapted to provide a signal when a channel is detected wherein said high frequency signal is received.

28. A channel selecting apparatus in a receiver in accordance with claim 26, wherein said means for providing a signal representation of the receiving state by said receiver is adapted to provide a signal when a channel is detected wherein said high frequency signal is not received.

* * * * *